(12) United States Patent
Li et al.

(10) Patent No.: US 11,974,392 B2
(45) Date of Patent: Apr. 30, 2024

(54) CIRCUIT BOARD AND DISPLAY DEVICE

(71) Applicant: Tianma Micro-Electronics Co., Ltd., Shenzhen (CN)

(72) Inventors: Lu Li, Wuhan (CN); Long Chen, Wuhan (CN); Lvshui Tan, Wuhan (CN)

(73) Assignee: TIANMA MICRO-ELECTRONICS CO., LTD., Shenzhen (CN)

( * ) Notice: Subject to any disclaimer, the term of this patent is extended or adjusted under 35 U.S.C. 154(b) by 71 days.

(21) Appl. No.: 17/585,386

(22) Filed: Jan. 26, 2022

(65) Prior Publication Data

US 2023/0171880 A1 Jun. 1, 2023

(30) Foreign Application Priority Data

Nov. 30, 2021 (CN) .......................... 202111441487.3

(51) Int. Cl.
*H05K 1/02* (2006.01)
(52) U.S. Cl.
CPC .................................. *H05K 1/0269* (2013.01)
(58) Field of Classification Search
CPC ........................... H05K 1/0269; H05K 1/0268
See application file for complete search history.

(56) References Cited

U.S. PATENT DOCUMENTS

| | | | | |
|---|---|---|---|---|
| 11,320,704 B2* | 5/2022 | Lee | ...................... | G02F 1/13452 |
| 2018/0026227 A1* | 1/2018 | Kim | ...................... | H10K 59/131 |
| | | | | 257/40 |
| 2020/0103689 A1* | 4/2020 | Hu | ...................... | G02F 1/13394 |

FOREIGN PATENT DOCUMENTS

| | | |
|---|---|---|
| CN | 1632646 A | 6/2005 |
| CN | 201540103 U | 8/2010 |
| CN | 103324343 B | 2/2016 |
| CN | 210323692 U | 4/2020 |
| CN | 111415578 A | 7/2020 |
| WO | 2020042288 A1 | 3/2020 |

OTHER PUBLICATIONS

Xiao Xing ., "A literary society, glue position deviation, glue lack, glue breakage, glue overflow detection (including source code), " Apr. 3, 2020. CSDN. China.

* cited by examiner

*Primary Examiner* — Hoa C Nguyen
(74) *Attorney, Agent, or Firm* — Anova Law Group, PLLC

(57) ABSTRACT

A circuit board and a display device are provided. The circuit board has a device area and a peripheral area surrounding the device area. The circuit board includes a substrate, a metal layer, a first insulating layer, an adhesive layer, and an adhesive overflow detection line. The metal layer, the first insulating layer, and the adhesive layer are disposed at a same side of the substrate. The metal layer and the first insulating layer cover at least a part of the peripheral area. The metal layer is disposed between the first insulating layer and the substrate. The adhesive layer is disposed at a side of the first insulating layer away from the substrate and in the peripheral area. The adhesive overflow detection line is located in the metal layer and the metal layer in the peripheral area is provided with hollow parts; and/or the adhesive overflow detection line is located in the first insulating layer and a portion of the first insulating layer in the peripheral area has a color different from other potions.

18 Claims, 19 Drawing Sheets

A-A

CIRCUIT BOARD AND DISPLAY DEVICE

CROSS-REFERENCE TO RELATED APPLICATION

This application claims the priority of Chinese Patent Application No. 202111441487.3, filed on Nov. 30, 2021, the content of which is incorporated herein by reference in its entirety.

TECHNICAL FIELD

The present disclosure generally relates to the field of display technology and, more particularly, relates to a circuit board and a display device.

BACKGROUND

At present, demands of display products for full screen, long battery life, and 5G communication are becoming more and more prominent. These demands all require structures of display modules to become more and more compact, such that some space can be provided to achieve greater battery capacity, smaller frames and larger antenna headroom, etc.

A size of a flexible printed circuit board (FPC) has a greater impact on compactness of a display module structure. In related technologies, when designing an FPC, in addition to meeting wiring requirements, an additional space is needed to be reserved for an adhesive film to overflow. Otherwise, the adhesive film may overflow to a golden finger area in a soft board area, inducing that the golden finger area cannot be bound with FPC or the soft board area becomes hard and cannot be bent. Therefore, the detection of adhesive overflow on flexible printed circuit boards is particularly important. At present, how to quickly and accurately detect whether the FPC has poor adhesive overflow has become one of the technical problems that need to be solved urgently at this stage.

SUMMARY

One aspect of the present disclosure provides a circuit board. The circuit board has a device area and a peripheral area surrounding the device area. The circuit board includes a substrate, a metal layer, a first insulating layer, an adhesive layer, and an adhesive overflow detection line. The metal layer, the first insulating layer, and the adhesive layer are disposed at a same side of the substrate. The metal layer and the first insulating layer cover at least a part of the peripheral area. The metal layer is disposed between the first insulating layer and the substrate. The adhesive layer is disposed at a side of the first insulating layer away from the substrate. The adhesive overflow detection line is disposed in the peripheral area. The adhesive overflow detection line is located in the metal layer and the metal layer in the peripheral area is provided with hollow parts; and/or the adhesive overflow detection line is located in the first insulating layer and a portion of the first insulating layer in the peripheral area has a color different from other portions of the first insulating layer.

Another aspect of the present disclosure provides a display device. The display device includes a circuit board. The circuit board has a device area and a peripheral area surrounding the device area. The circuit board includes a substrate, a metal layer, a first insulating layer, an adhesive layer, and an adhesive overflow detection line. The metal layer, the first insulating layer, and the adhesive layer are disposed at a same side of the substrate. The metal layer and the first insulating layer cover at least a part of the peripheral area. The metal layer is disposed between the first insulating layer and the substrate. The adhesive layer is disposed at a side of the first insulating layer away from the substrate. The adhesive overflow detection line is disposed in the peripheral area. The adhesive overflow detection line is located in the metal layer and the metal layer in the peripheral area is provided with hollow parts; and/or the adhesive overflow detection line is located in the first insulating layer and a portion of the first insulating layer in the peripheral area has a color different from other portions of the first insulating layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
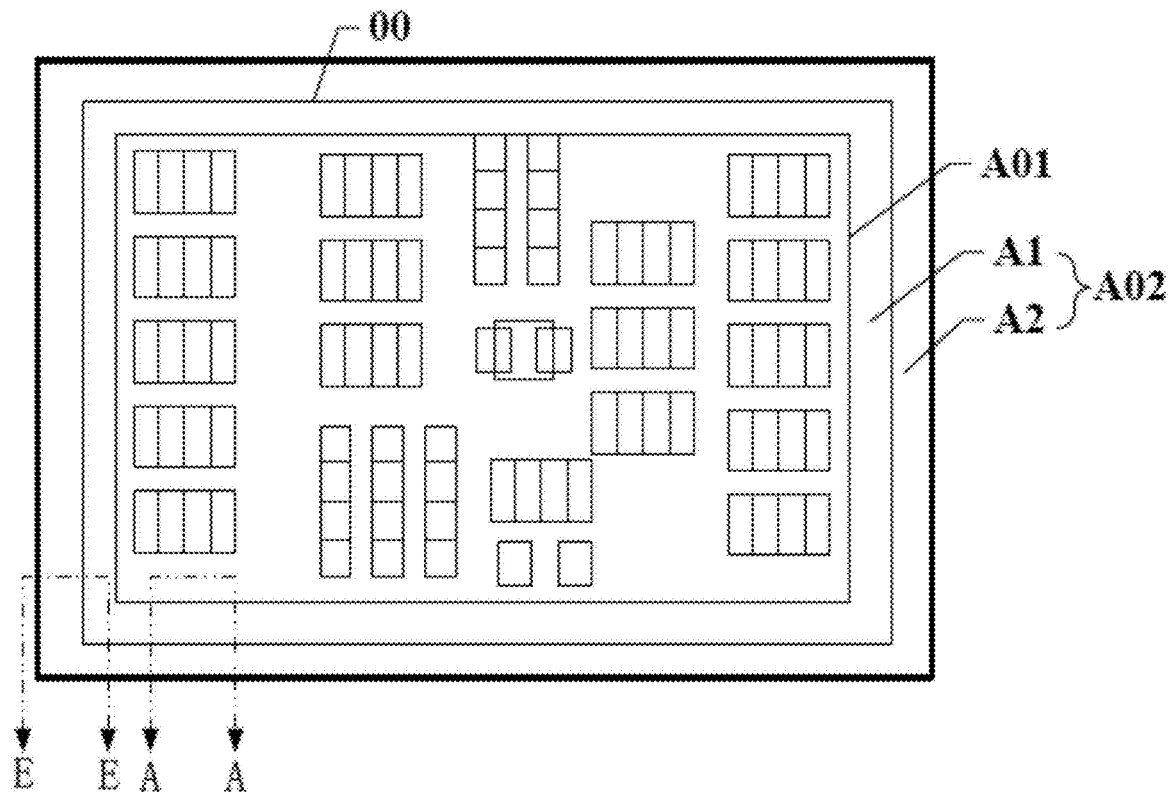
FIG. 1 illustrates a top view of an exemplary circuit board consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

As used herein, relational terms such as first and second are only used to distinguish one entity or operation from another entity or operation, and do not necessarily require or imply any such actual relationship between these entities or operations or order. Moreover, the terms "including", "comprising" or any other variants thereof are intended to cover non-exclusive inclusion, such that a process, method, article, or device that includes a series of elements includes not only those elements, but also those that are not explicitly listed or also include elements inherent to this process, method, article or equipment. If there are no more restrictions, the elements defined by the sentence "including . . . " do not exclude the existence of other same elements in the process, method, article, or equipment that includes the elements.

It should be understood that when describing the structure of a component, when a layer or area is referred to as being "on" or "above" another layer or another area, it may mean directly on the other layer or area, or it may also include other layers or areas between it and another layer or another area. And, if the component is turned over, the layer or area will be "below" or "under" the other layer or area.

Figure 2:
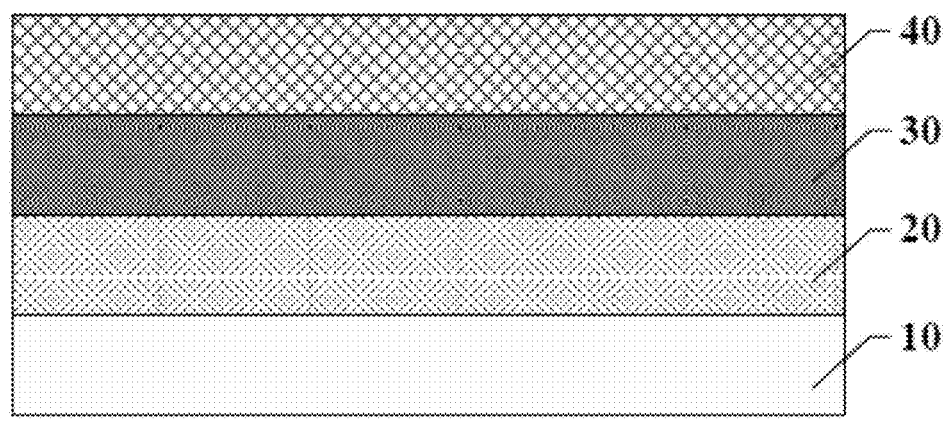
FIG. 2 illustrates a cross-sectional view of the circuit board in FIG. 1 along an A-A direction consistent with various disclosed embodiments in the present disclosure.

The present disclosure provides a circuit board. FIG. 1 illustrates a top view of an exemplary circuit board provided by one embodiment of the present disclosure; and FIG. 2 illustrates a cross-sectional view of the circuit board in FIG. 1 along an A-A direction. As shown in FIG. 1 and FIG. 2, the circuit board 100 may include a device area A01 and a peripheral area A02 surrounding the device area A01. The circuit board may include a substrate 10, a metal layer 20, a first insulating layer 30 and an adhesive layer 40. The metal layer 20, the first insulating layer 30 and the adhesive layer 40 may be arranged on the same side of the substrate 10. The metal layer 20 and the first insulating layer 30 may cover at least part of the peripheral area A02. The metal layer 20 may be located between the first insulating layer 30 and the substrate 10, and the adhesive layer 40 may be located at a side of the first insulating layer 30 away from the substrate 10.

An adhesive overflow detection line 00 may be provided in the peripheral area A02. The adhesive overflow detection line 00 may be located on the metal layer 20, and the metal layer 20 in the peripheral area A02 may be provided with hollow parts 21; and/or the adhesive overflow detection line 00 may be located on the first insulating layer 30. The color of the first insulating layer 30 located in the peripheral area A02 may be different.

For description purposes only, the embodiment in FIG. 1 where the circuit board has a rectangular structure is used as an example to illustrate the present disclosure and does not limit the scope of the present disclosure. In some other embodiments, the circuit board may have another suitable shape. Also, FIG. 2 only shows the film layer structure of a portion of the circuit board and does not represent the actual sizes of each film layer. In some other embodiments, the circuit board may include some other film layer structures other than the film layer structure shown in FIG. 2.

Optionally, the circuit board provided by the present disclosure may be a flexible printed circuit board (FPC), or a rigid printed circuit board (PCB).

In the embodiment of the present disclosure shown in FIG. 1 and FIG. 2, the circuit board may include the device area A01 and the peripheral area A02 surrounding the device area A01. Circuit structures including signal lines and soldering pads may be disposed in the device area A01. The device area A01 may be used to bind electronic components, etc. For example, gold fingers and the like may be provided in the peripheral area A02. The metal layer 20 may be provided on the substrate 10 of the circuit board, and the aforementioned circuit structures may be formed by the metal layer 20. Optionally, the metal layer 20 on the circuit board may be a copper foil. The first insulating layer 30 may be provided on the side of the metal layer 20 away from the substrate 10. The first insulating layer 30 may be used to cover a part of the metal layer 20 that does not need to be exposed on the surface of the circuit board, and insulate and isolate adjacent metal wires. An exposed part of the metal layer 20 may be, for example, pads or the like, which may be used to bind electronic components and the like. In the device area A01, when the electronic components are bound on the bonding pads, the exposed parts of the bonding pads may be covered by the adhesive layer, which may not only be waterproof, but also play a role in fixing the electronic components.

When using the adhesive layer 40 to fix the pads and the electronic components, an ideal state is to use the adhesive layer to cover the entire device area A01, such that the device area A01 has better waterproof performance and may also play a better role in fixing the components. However, the adhesive layer may have a certain degree of fluidity. In the process of forming the adhesive layer, a part of the adhesive may flow to the peripheral area A02. To determine whether the adhesive layer has poor adhesive overflow, etc., the present disclosure may provide an adhesive overflow detection line 00 in the peripheral area A02 of the circuit board. When the adhesive layer does not exceed the adhesive overflow detection line 00, it may indicate that the circuit board has no adhesive overflow. When the adhesive layer exceeds the adhesive overflow detection line 00, it may indicate that the circuit board has poor adhesive overflow. Optionally, the adhesive overflow detection line 00 introduced in the circuit board provided in the embodiments of the present disclosure may not be a physical structure, but the metal layer 20 and/or the first insulating layer 30 may be multiplexed as the adhesive overflow detection line 00. The adhesive overflow detection line 00 in the figure may only be used to indicate the position of the adhesive overflow detection line.

Figure 3:
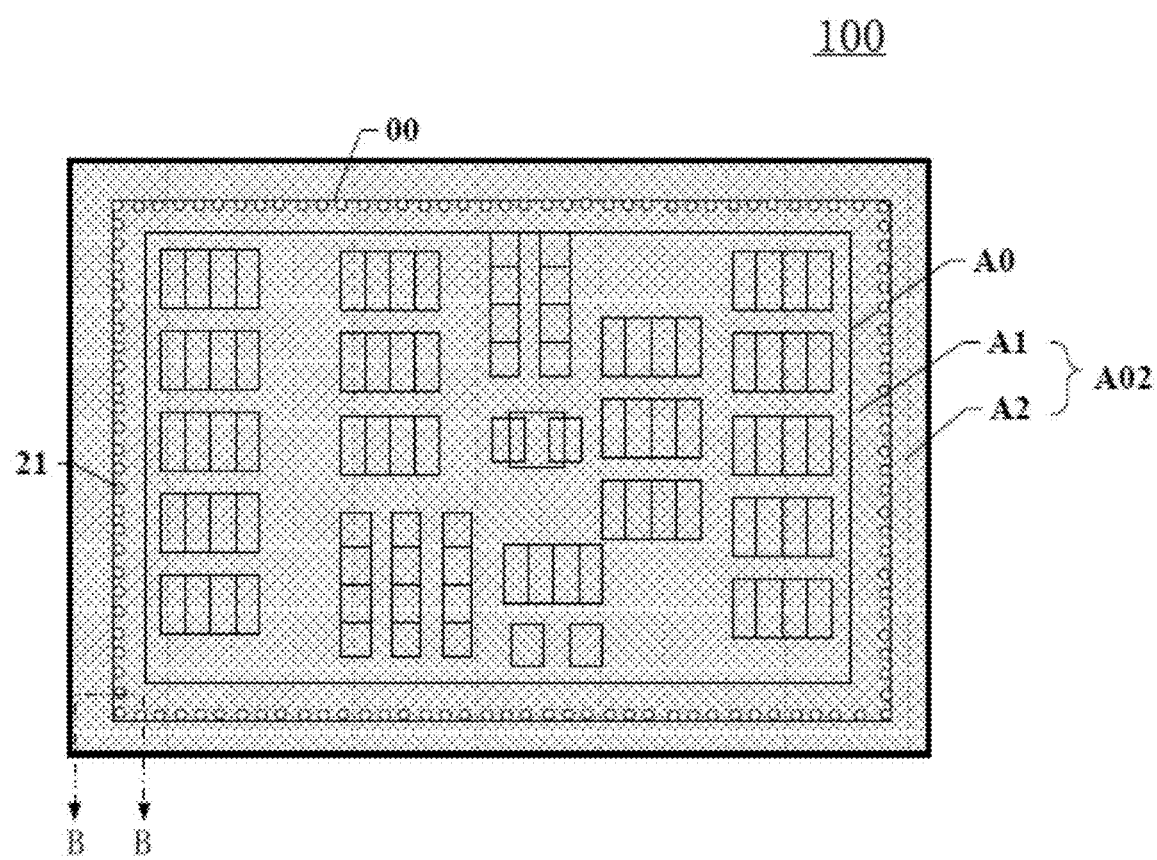
FIG. 3 illustrates a top view of another exemplary circuit board consistent with various disclosed embodiments in the present disclosure.

When the adhesive overflow detection line 00 is located at the metal layer 20, the metal layer 20 in the peripheral area A02 may be provided with the hollow parts 21. For example, as shown in FIG. 3, a color state of the adhesive layer at a position corresponding to the hollow parts 21 may be different from color states of other positions of the adhesive layer without the hollow parts 21. Correspondingly, by visually observing the relative positional relationship between the adhesive layer and the hollow parts 21, whether there is adhesive overflow may be accurately determined. FIG. 3 shows another top view of the circuit board provided by the embodiment of the present disclosure. When the adhesive overflow detection line 00 is located in the first insulating layer 30, parts of the first insulating layer 30 at two sides of the adhesive overflow detection line 00 may be set to different colors. Correspondingly, by visually observing the relative positional relationship between the adhesive layer and the parts of the first insulating layer 30 with different colors, whether there is adhesive overflow may be accurately determined. Therefore, in the present disclosure, by providing the adhesive overflow detection line 00 on the circuit, the adhesive overflow state of the circuit board may be determined visually. While improving the detection accuracy, it may not only save the detection cost, but also may greatly improve the detection efficiency, and then improve the quality of the display device.

As shown in FIG. 1, in one embodiment of the present disclosure, the peripheral area A02 may include a first peripheral area A1 and a second peripheral area A2. The first peripheral area A1 may surround the device area A01, and the second peripheral area A2 may surround the first peripheral area A1. The adhesive overflow detection line 00 may coincide with a contour of the first peripheral area A1 away from the device area A01.

Specifically, in the circuit board provided by the present embodiment, the peripheral area A02 may include the first peripheral area A1 and the second peripheral area A2. The first peripheral area A1 may surround the device area A01, and the second peripheral area A2 may surround the first peripheral area A1. The adhesive overflow detection line 00 may coincide with the contour of the first peripheral area A1 away from the device area A01. Therefore, when the adhesive layer exceeds the contour of the first peripheral area A1 away from the device area A01 and reaches the second peripheral area A2, it may be determined that the circuit board has poor adhesive overflow. When the adhesive layer does not exceed the contour of the first peripheral area A1 away from the device area A01, it may be judged that the circuit board does not have adhesive overflow. The first peripheral area A1 in this embodiment may be regarded as an adhesive overflow area. By setting the adhesive overflow area in the peripheral area A02, the adhesive layer may be allowed to overflow from the device area A01 to a certain extent, without affecting the normal use of the circuit board. The production yield of circuit boards may be improved.

Figure 4:
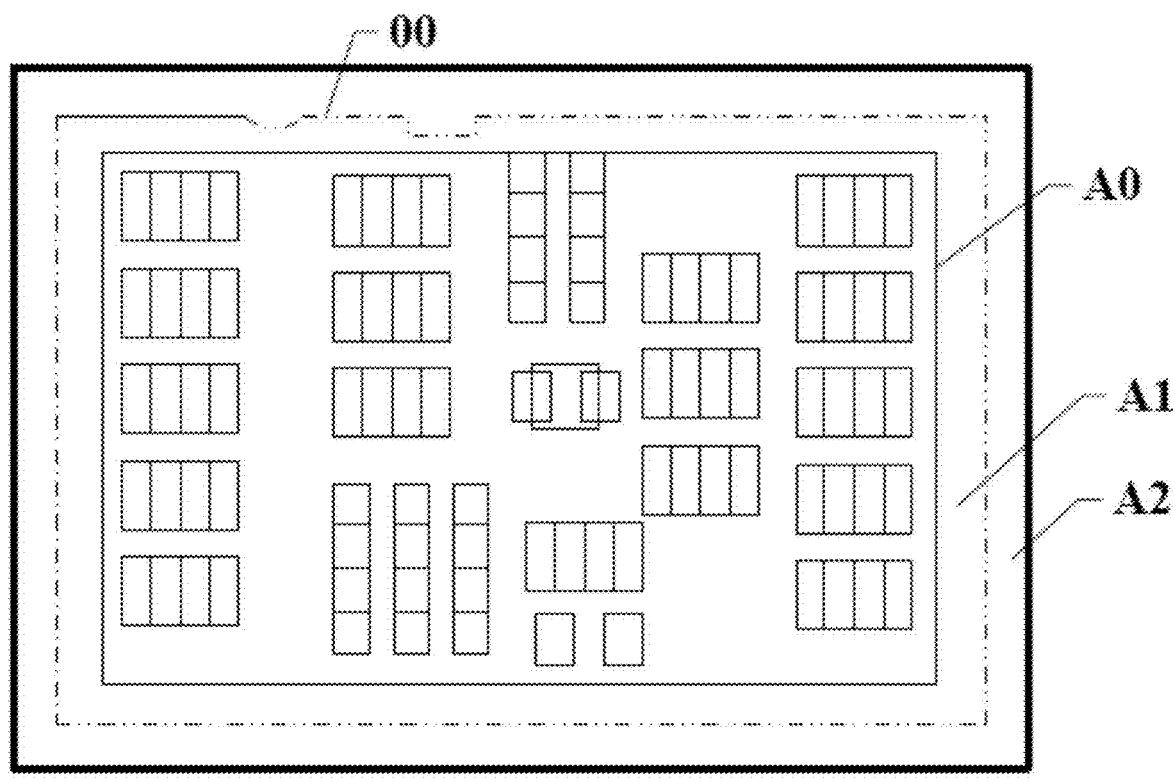
FIG. 4 illustrates a top view of another exemplary circuit board consistent with various disclosed embodiments in the present disclosure.

For description purposes only, the embodiment in FIG. 1 where the contour of the first peripheral area A1 away from the device area A01 is rectangular, that is, the contour of the adhesive overflow detection line 00 is rectangular, is used as an example to illustrate the present disclosure, and does not limit the scope of the present disclosure. In various embodiments of the present disclosure, the contour of the adhesive overflow detection line 00 may be configured to be another shape other than the rectangle. For example, in one embodiment shown in FIG. 4 illustrating another top view of the circuit board, the overflow detection line 00 may be a non-rectangular-shaped structure.

Figure 5:
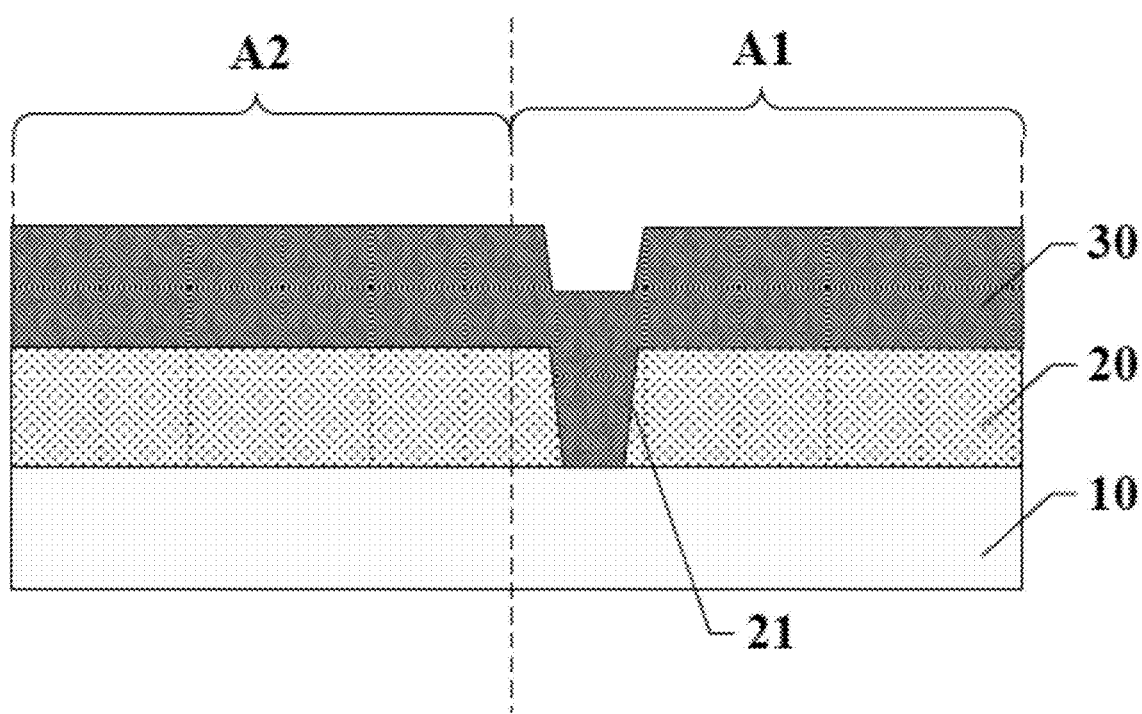
FIG. 5 illustrates a cross-sectional view of the circuit board in FIG. 3 along a B-B direction consistent with various disclosed embodiments in the present disclosure.

As shown in FIG. 3 and FIG. 5, FIG. 5 shows a cross-sectional view of the circuit board in FIG. 3 along a B-B direction. This embodiment in FIG. 3 and FIG. 5 illustrates a structure of the metal layer 20 in the peripheral area A02, and may be suitable for a solution in which the metal layer 20 in the peripheral area A02 is multiplexed as the adhesive overflow detection line 00.

In one embodiment, the hollow parts 21 may penetrate through the metal layer 20 along the direction perpendicular to the substrate 10. The embodiment where the metal layer 20 is located in the first peripheral area A1 is provided with the hollow parts 21 is used as an example for description. When the hollow parts 21 are provided on the metal layer 20 of the peripheral area A02, the hollow parts 21 may penetrate through the metal layer 20 in the thickness direction of the metal layer 20, that is, the hollow parts 21 may expose the substrate 10. When forming the first insulating layer 30 on the metal layer 20, the first insulating layer 30 may fill the hollow parts 21, such that the color state of a part of the first insulating layer 30 at the position of the hollow parts 21 may be different from the color state of other parts of the first insulating layer at positions without the hollow parts 21. When forming the adhesive layer in the device area A01, when the adhesive layer flows to the corresponding position of the hollow parts 21, the color state of a part of the adhesive layer at the position of the hollow parts 21 may be different from the color state of the positions without hollow parts 21. Correspondingly, the positional relationship between the adhesive layer and the hollow parts 21 may be accurately discriminated by visualizing, and then the positional relationship between the adhesive layer and the adhesive overflow detection line 00 may be discerned. Therefore, whether there is poor adhesive overflow may be determined.

Further, when the first insulating layer 30 is formed on the metal layer 20, a recess may be formed at the surface of the first insulating layer 30 away from the metal layer 20 at the position of the hollow parts 21. In the process of forming the adhesive layer, the adhesive layer may have certain fluidity. When the adhesive layer flows from the device area A01 to the peripheral area A02, since the metal layer 20 of the peripheral area A02 may be provided with the hollow parts 21 and the hollow parts 21 may penetrate through the metal layer along the thickness direction of the metal layer 20, a part of the adhesive layer will flow into the recess corresponding to the hollow parts 21 on the first insulating layer 30, that is, flow in the recess toward the direction of the substrate 10. Therefore, an amount of continuous outward diffusion may be reduced. The spread of the adhesive layer may be prevented to a certain extent and the possibility of poor adhesive overflow on the circuit board may be reduced.

Figure 6:
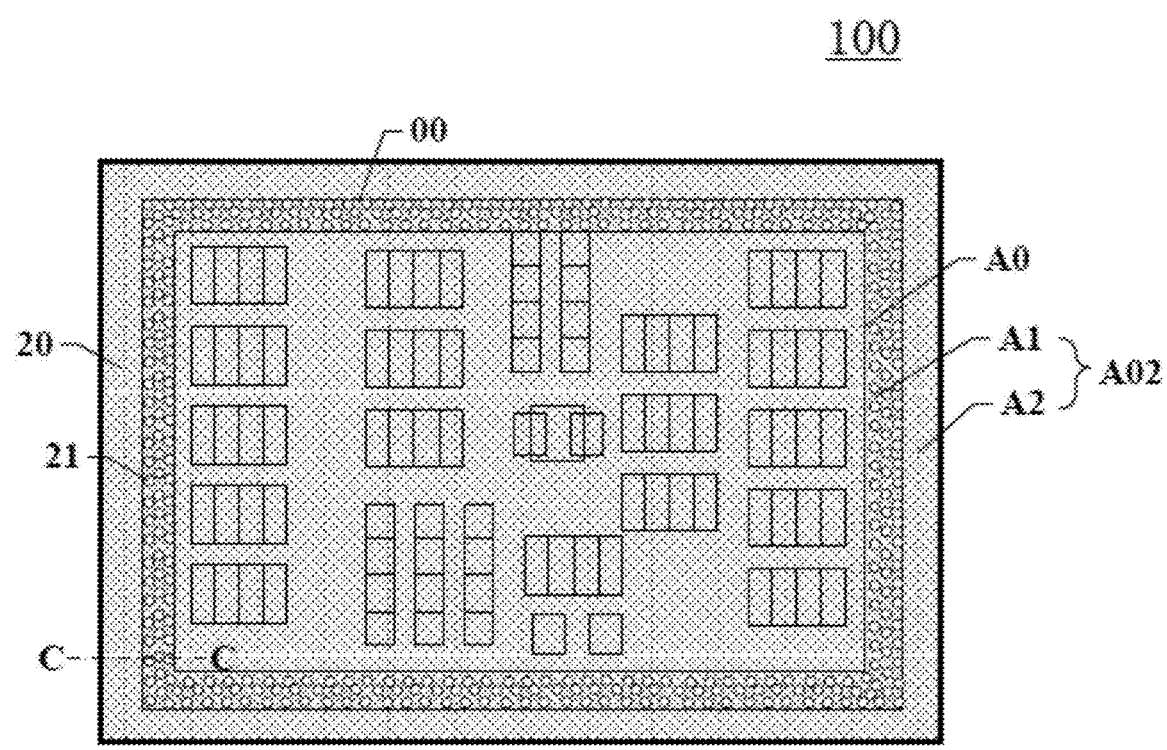
FIG. 6 illustrates a top view of another exemplary circuit board consistent with various disclosed embodiments in the present disclosure.
Figure 7:
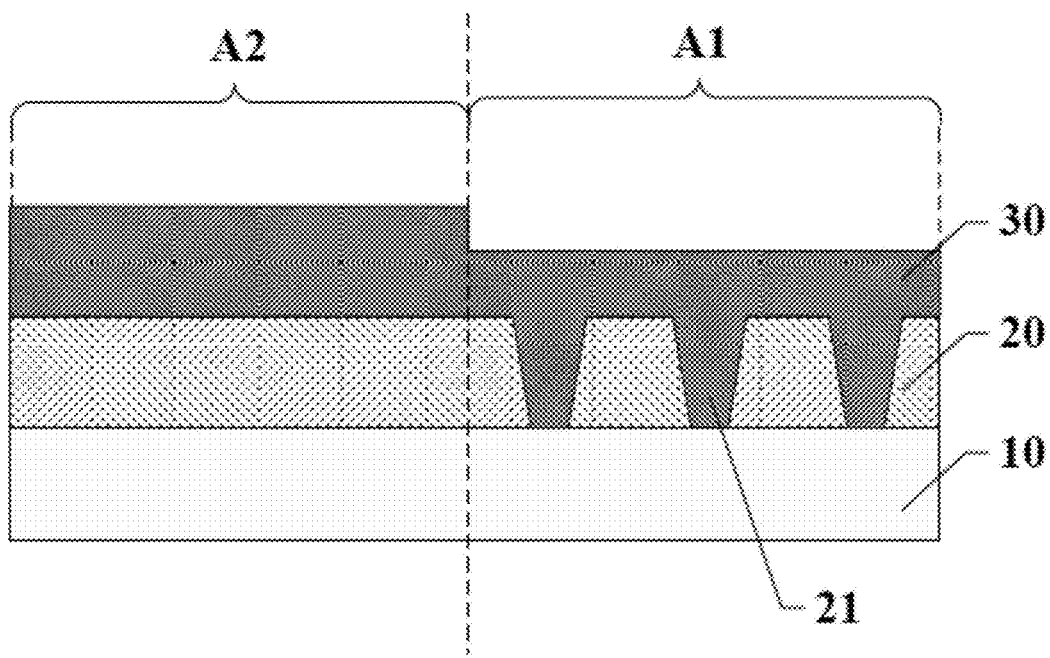
FIG. 7 illustrates a cross-sectional view of the circuit board in FIG. 6 along a C-C direction consistent with various disclosed embodiments in the present disclosure.

In the embodiment shown in FIG. 3, a portion of the area of the first peripheral area A1 may be provided with the hollow parts 21. In some other embodiments, the hollow parts 21 may be disposed at each area of the first peripheral area A1. For example, FIG. 6 and FIG. 7 show an embodiment where the hollow parts 21 are disposed at each area of the first peripheral area A1. FIG. 6 illustrates a top view of the circuit board of the present embodiment and FIG. 7 illustrates a cross-sectional view of the circuit board in FIG. 6 along a C-C direction.

As shown in FIG. 6 and FIG. 7, in one embodiment, a portion of the metal layer 20 located in the first peripheral area A1 may be provided with the hollow parts 21, and a remaining portion of the metal layer 20 located in the second peripheral area A2 may be not provided with the hollow parts 21. The contour of the metal layer 20 located in the first peripheral area A1 away from the device area A01 may be multiplexed as the adhesive overflow detection line 00.

Specifically, in the present embodiment, when the portion of the metal layer 20 in the first peripheral area A1 is provided with the hollow parts 21 and the portion of the metal layer 20 in the second peripheral area A2 is not provided with the hollow parts 21, the contour of the metal layer 20 in the first peripheral area A1 far away from the device area A01 may be used as the adhesive overflow detection line 00. When the adhesive layer is formed on the circuit board 25, part of the adhesive layer may diffuse from the first peripheral area A1 with the hollow parts 21 to the second peripheral area A2 without the hollow parts 21. Correspondingly, it can be visually detected that the morphology has changed significantly when the adhesive layer flows to the second peripheral area A2, such that it may be quickly judged that the circuit board has poor adhesive overflow.

Optionally, the hollow parts 21 provided on the metal layer 20 may be distributed in each area of the first peripheral area A1, and may penetrate the metal layer 20 along the thickness direction of the metal layer 20. When the first insulating layer 30 is formed on the side of the metal layer 20 away from the substrate 10, in the first peripheral area A1, a part of the first insulating layer 30 may fill the hollow parts 21, such that a surface of a portion of the first insulating layer 30 in the first peripheral area A1 away from the substrate 10 may be lower than a surface of a portion of the first insulating layer 30 in the second peripheral area A2 away from the substrate 10, and a height difference may be formed between the two. When the adhesive layer diffuses from the device area A01 into the first peripheral area A1, the height difference between the first insulating layer 30 in the peripheral area A1 and the second peripheral area A2 may prevent the adhesive layer from further diffusing to the second peripheral area A2. That is, the second peripheral area A2 may have a certain blocking effect on the adhesive layer, to prevent the overflow of the adhesive layer. The possibility of poor adhesive overflow on the circuit board may be reduced, improving the production yield of the circuit board.

Further, when the hollow parts 21 provided on the metal layer 20 are distributed in each area of the first peripheral area A1 and the first insulating layer 30 covers the side of the metal layer 20 away from the substrate 10, recesses (not shown in FIG. 7) may be formed at the positions corresponding to the hollow parts 21. When the adhesive layer diffuses from the device area A01, each recess may accommodate a part of the adhesive layer. Cooperation of the recesses may further prevent the adhesive layer from diffusing into the second periphery area A2. Therefore, the present setup may be also beneficial to further reduce the possibility of the adhesive layer diffusing into the second peripheral area A2 and improve the production yield of the circuit board.

The embodiment shown in FIG. 6 shows a solution in which the hollow parts 21 in the first peripheral area A1 are circular. In some other embodiments of the present disclosure, the hollow parts 21 in the first peripheral area A1 may also be set in other shapes such as, oval, square, diamond, etc. Of course, in some other embodiments, the hollow parts 21 may also be embodied as some other structures, such as a grid-like structure as shown in FIG. 8, or a curved wiring structure as shown in FIG. 9.

Figure 8:
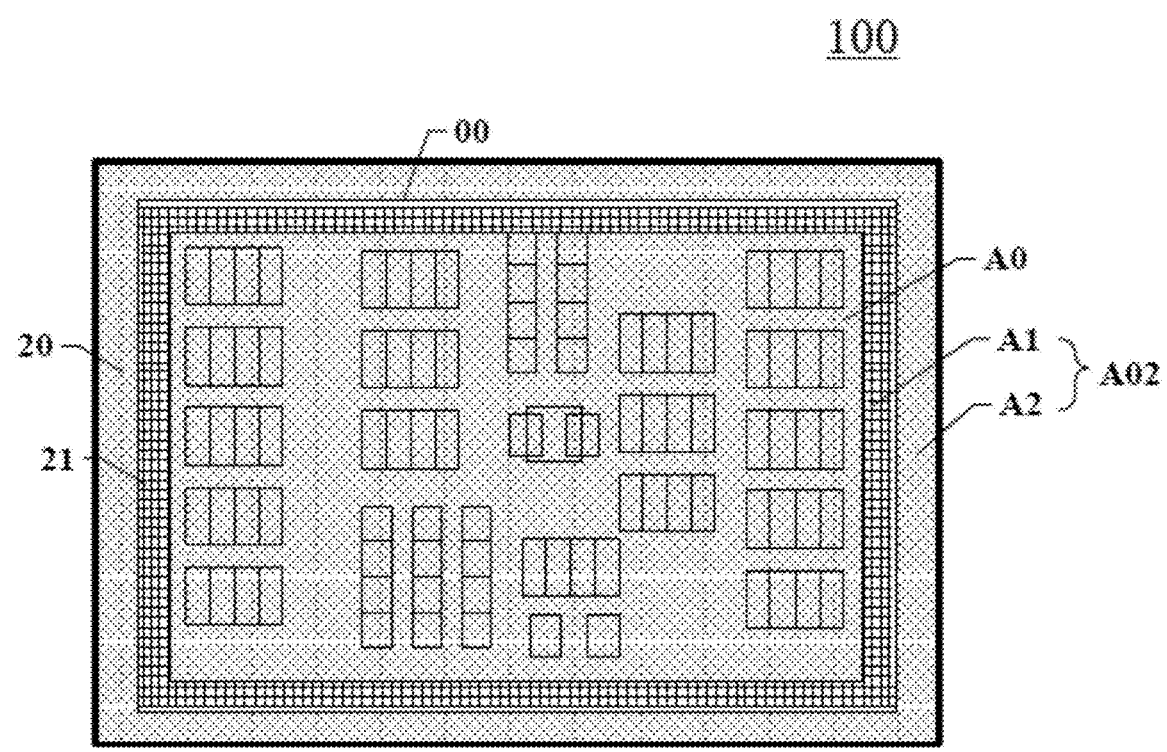
FIG. 8 illustrates a top view of another exemplary circuit board consistent with various disclosed embodiments in the present disclosure.
Figure 9:
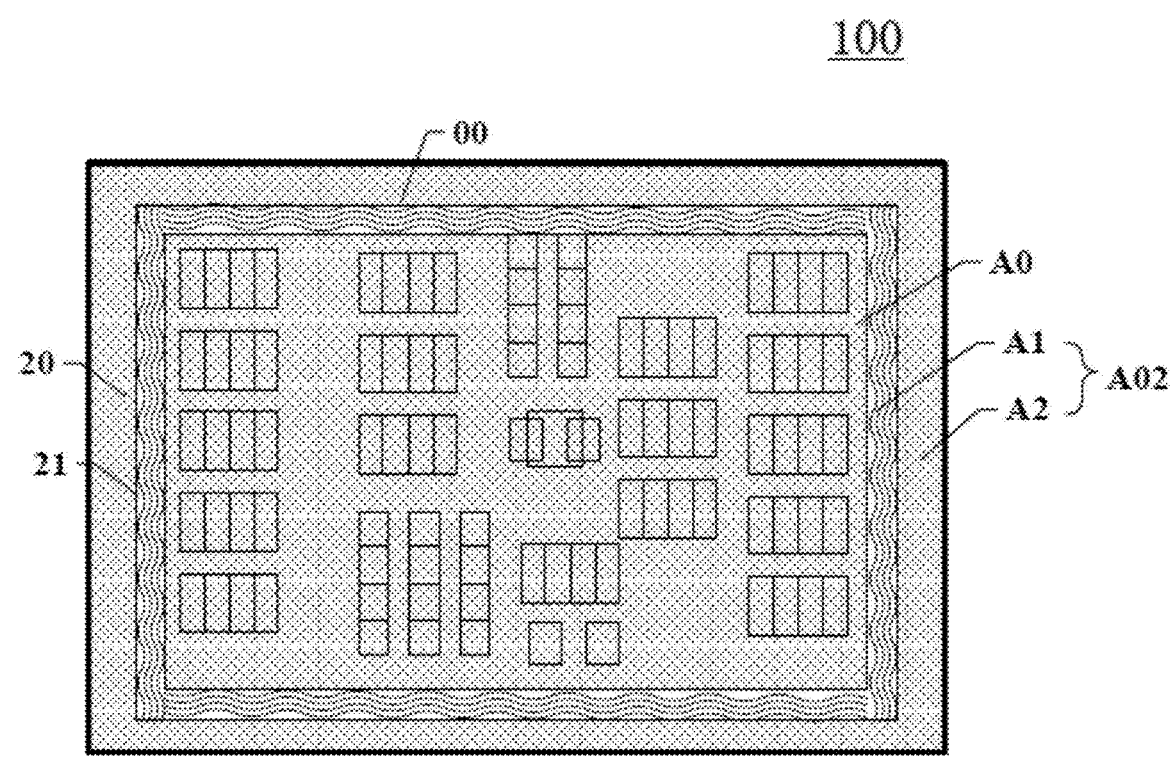
FIG. 9 illustrates a top view of another exemplary circuit board consistent with various disclosed embodiments in the present disclosure.

FIGS. 8 and 9 respectively show another top view of a circuit board provided by one embodiment. As shown in FIG. 8 and FIG. 9, the hollow parts 21 in the first peripheral area A1 may have a grid-like structure or a curved wiring structure.

Specifically, FIGS. 8 and 9 show another top view of a circuit board where the hollow parts 21 in the first peripheral area A1 may have a grid-like structure or a curved wiring structure respectively. In the embodiment shown in FIG. 8, in the metal layer 20 of the grid structure, each grid may be regarded as a hollow part 21. In the embodiment shown in FIG. 9, the metal layer 20 of the curved wiring structure may form a plurality of hollow parts 21 of the curved structure. When the metal layer 20 in a peripheral area A1 is set up in a grid structure or a curved wiring structure, it may be beneficial to further reduce the overall thickness of the metal layer 20 in the first peripheral area A1, and the film layer in the second peripheral area A2 may form a barrier wall to prevent the adhesive layer from diffusing. The adhesive layer diffusing from the device area A01 to the first peripheral area A1 may first gather in the first peripheral area A1 after reaching the first peripheral area A1, beneficial to reduce the occurrence of poor adhesive overflow on the circuit board.

As shown in FIGS. 2, 8, and 9, the grid structure in the embodiment shown in FIG. 8 may be distributed throughout the first peripheral area A1, and the curved wiring structure in FIG. 9 may be also distributed throughout the first peripheral area A1. Further, when the grid structure or the curved wiring structure is adopted, the contact area between the hollow parts 21 and the first insulating layer 30 may be effectively increased. That is, when the first insulating layer 30 is formed in the first peripheral area A1, more of the first insulating layer 30 may fill the hollow parts 21, which may further increase the height difference between the first insulating layer 30 in the first 10 peripheral area A1 and the first insulating layer 30 in the second peripheral area A2. The barrier effect of the adhesive layer may be more obvious, which may be more beneficial to reducing or avoiding the occurrence of bad adhesive overflow, and improving the production yield of circuit boards.

When the metal layer 20 is multiplexed as the adhesive overflow detection line 00 and the metal layer 20 of the first peripheral area A1 is provided with the hollow parts 21, the metal layer 20 located in the first peripheral area A1 and the metal layer 20 located in the second peripheral area A2 may be connected with each other and may be integrally formed, such that there may be no need to introduce a new film layer on the circuit board, which is beneficial to simplify the film structure of the circuit board.

The above-mentioned embodiment shows an implementation of providing the hollow parts 21 on the metal layer 20 of the first peripheral area A1 when the metal layer 20 is multiplexed as the adhesive overflow detection line 00. In some other embodiments of the present disclosure, when the metal layer 20 is multiplexed as the adhesive overflow detection line 00, the position of the hollow parts 21 on the metal layer 20 may also be implemented in other ways. For example, in another embodiment shown in FIG. 10 illustrating another top view of the circuit board, another distribution scheme of the hollow parts 21 on the metal layer 20 in the peripheral area A02 may be adopted.

Figure 10:
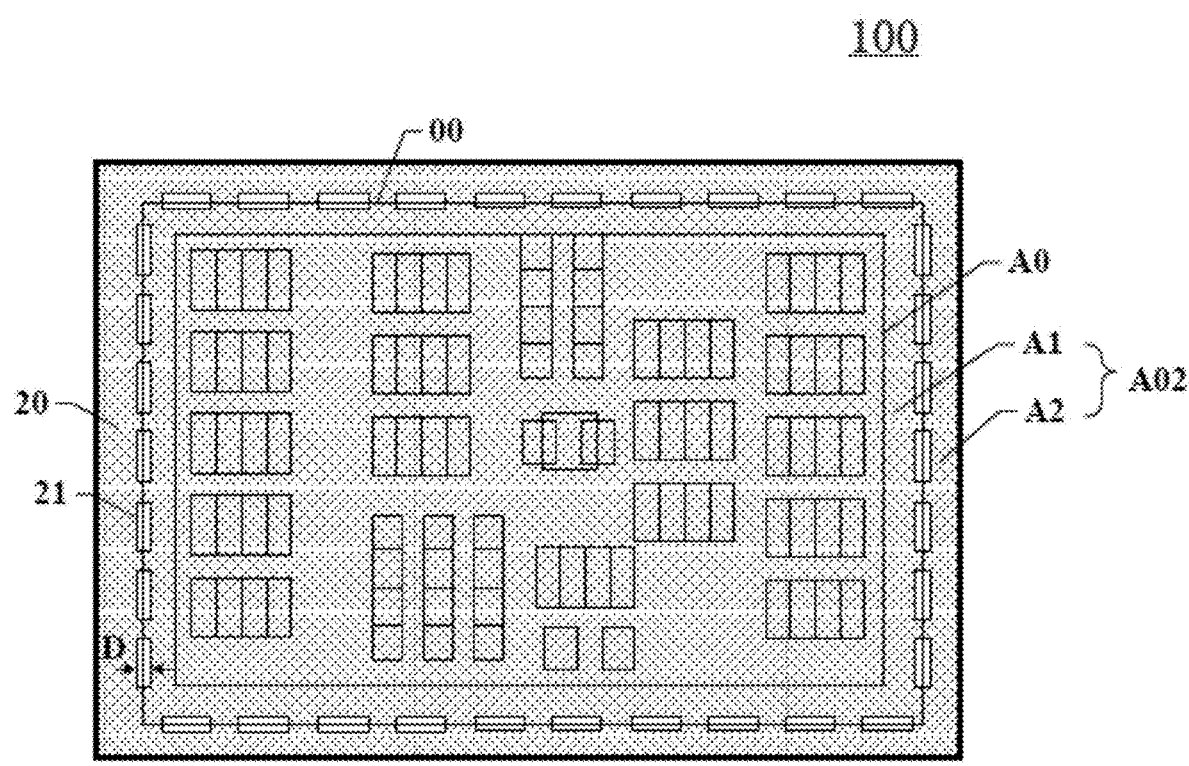
FIG. 10 illustrates a top view of another exemplary circuit board consistent with various disclosed embodiments in the present disclosure.

As shown in FIG. 10, in one embodiment, the contour of a portion of the metal layer 20 in the first peripheral area A1 away from the device area A01 may be multiplexed as the adhesive overflow detection line 00, and the hollow parts 21 may be disposed at a portion of the metal layer 20 between the first peripheral area A1 and the second peripheral area A2.

Specifically, in the embodiment shown in FIG. 10, when the contour of the portion of the metal layer 20 in the first peripheral area A1 far away from the device area A01 is multiplexed as the adhesive overflow detection line 00, the hollow parts 21 may be disposed only at the portion of the metal layer 20 between the first peripheral area A1 and the second peripheral area A2. That is, the hollow parts 21 on the metal layer 20 may be exactly set on the adhesive overflow detection line 00. When forming the adhesive layer on the circuit board, when the adhesive layer diffuses from the device area A01 to the first peripheral area A1, if part of the adhesive layer diffuses to the position of the hollow parts 21 corresponding to the adhesive overflow detection line 00, a color state of the adhesive layer at a position corresponding to the hollow parts 21 may be different from a color states of other positions of the adhesive layer without the hollow parts 21. Correspondingly, when the adhesive layer diffuses from the hollow parts 21 at the position of the adhesive overflow detection line 00 to the second peripheral area A2, it may be clearly determined by visual inspection that the adhesive overflow has occurred, which may be also beneficial to improve the efficiency of adhesive overflow detection and the quality of the display device.

When the hollow parts 21 are arranged between the portions of the metal layer 20 located in the first peripheral area A1 and in the second peripheral area A2, the hollow parts 21 may be regarded as being arranged to surround the extension direction of the adhesive overflow detection line 00. In one embodiment, the adhesive overflow detection line 00 may be a rectangle, and correspondingly the hollow parts 21 may be arranged in sequence along the edges of the rectangle. The embodiment in FIG. 10 where the hollow parts 21 are rectangular is used as an example for illustration. Optionally, the extension direction of the long side of the rectangular hollow parts 21 may be the same as the extension direction of the adhesive overflow detection line 00.

As shown in FIG. 10, in another embodiment, along the direction from the second peripheral area A2 to the first peripheral area A1, the width of the hollow parts 21 may be D, where D≤0.1 mm. Specifically, in the present embodiment, when the width of the hollow parts 21 in the direction from the second peripheral area A2 to the first peripheral area A1 is set to be less than or equal to 0.1 mm, it may be more accurately identified whether the circuit board has adhesive overflow, which may improve the accuracy of adhesive overflow detection.

Figure 11:
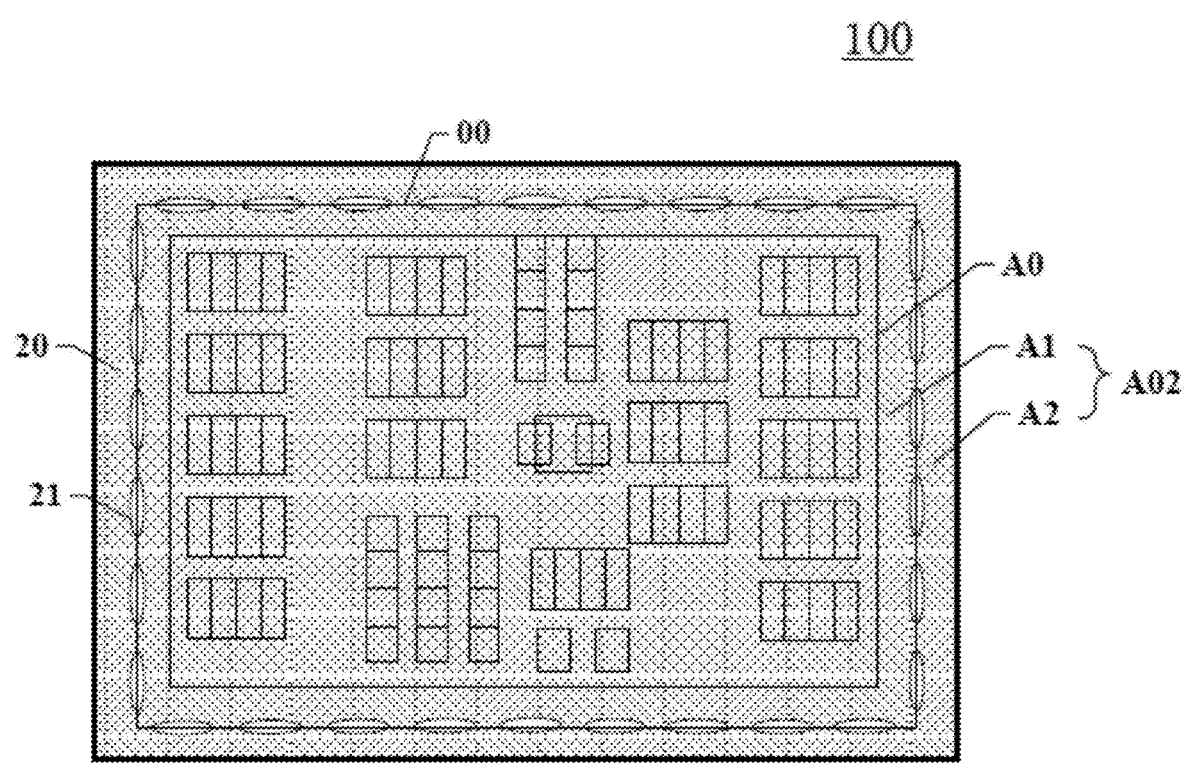
FIG. 11 illustrates a top view of another exemplary circuit board consistent with various disclosed embodiments in the present disclosure.

It should be noted that when the hollow parts 21 are disposed between the portions of the metal layer 20 in the first peripheral area A1 and in the second peripheral area A2, the embodiment in FIG. 10 where the hollow parts 21 have a rectangular structure is used as an example for illustration only, and does not limit the scope of the present disclosure. In other embodiments, the hollow parts 21 may also have other shapes, such as ellipse, circle, or a combination thereof. For example, in one embodiment, the hollow parts 21 set along the edge of the adhesive overflow detection line 00 may have a plurality of shapes including square, oval, or round. In one embodiment shown in FIG. 11, the hollow parts 21 may have an oval shape. When the hollow parts 21 are ellipses, a long axis direction of the ellipses may be the same as the extension direction of the overflow detection line 00. The hollow parts 21 may also be used as a barrier wall structure, to prevent the adhesive layer from overflowing to a certain extent. FIG. 11 is a top view of another circuit board provided by the present embodiment.

In the above embodiments, the metal layer 20 may be multiplexed as the adhesive overflow detection line 00. In some other embodiments, the first insulating layer 30 may be multiplexed as the adhesive overflow detection line 00. For example, in another embodiment illustrated in FIG. 12 showing a top view of another circuit board, the portion of the first insulating layer 30 in the peripheral area A02 may be multiplexed as the adhesive overflow detection line 00.

Figure 12:
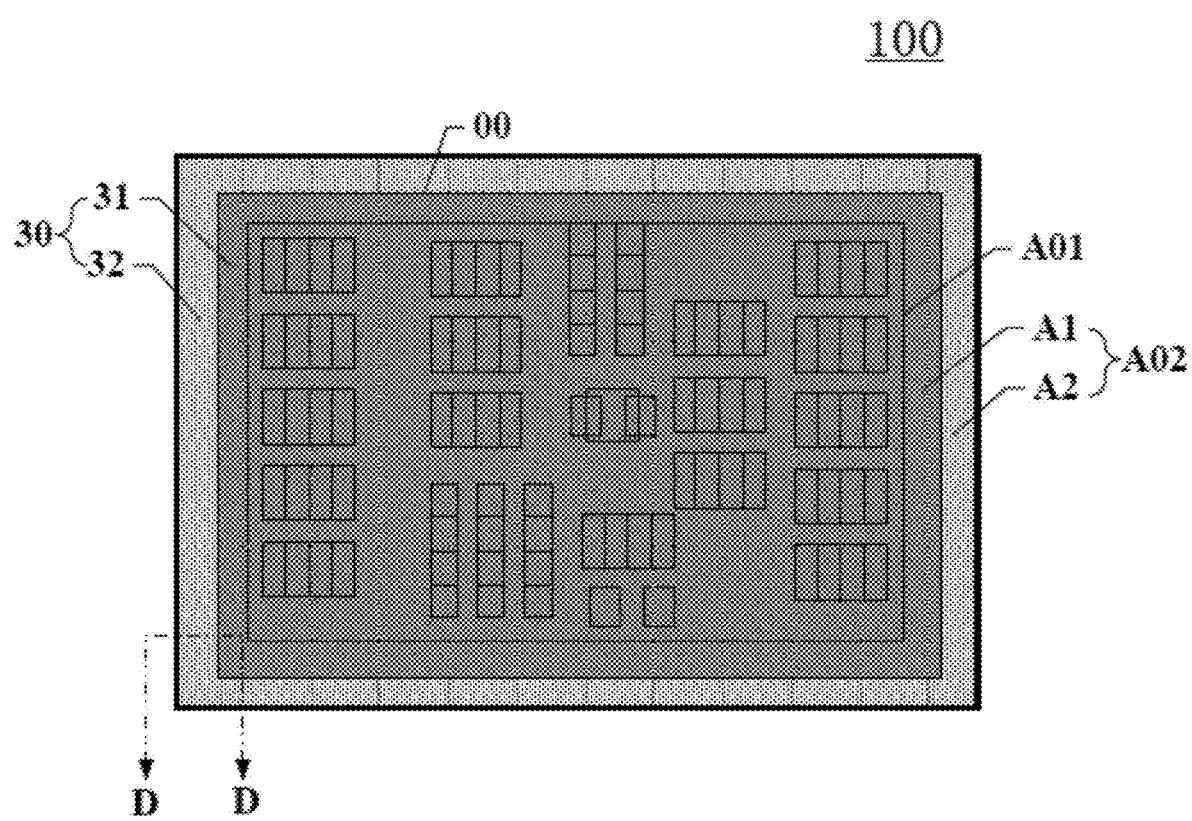
FIG. 12 illustrates a top view of another exemplary circuit board consistent with various disclosed embodiments in the present disclosure.

As shown in FIG. 12, in one embodiment, the first insulating layer 30 may include a first portion 31 located in the first peripheral area A1 and a second portion 32 located in the second peripheral area A2. The colors of the first portion 31 and the second portion 32 may be different, and the contour of the first portion 31 away from the device area A01 may be multiplexed as the adhesive overflow detection line 00.

Specifically, in the embodiment of FIG. 12, the different colors of the portions of the first insulating layer 30 in the first peripheral area A1 and the second peripheral area A2 may be represented through different fillings. At this time, the contour of the portion of the first insulating layer 30 away from the device area A01 may be multiplexed as the adhesive overflow detection line 00. Optionally, the colors of the adhesive layer and the first insulating layer 30 may be also different. In the process of forming the adhesive layer is formed in the circuit board 10, the adhesive layer may overflow from the device area A01, and the color that can be observed by the naked eye may be the first color when the adhesive layer overflows to the first peripheral area A1. Since the colors of the portions of the first insulating layer 30 in the first peripheral area A1 and the second peripheral area A2 may be different, when the adhesive layer further overflows from the first peripheral area A1 to the second peripheral area A2, the color that can be observed by the naked eye may be the second color. The second color and the first color may be two different colors. Therefore, by visual inspection, it may be quickly determined whether the adhesive layer in the circuit board overflows to the second peripheral area A2, that is, poor adhesive overflow may be quickly identified. The detection method may be simple, which may not only help to save the detection cost, but also help to improve the detection efficiency, thereby improving the quality of the display device.

In one embodiment, the first insulating layer 30 may be an ink layer.

As shown in FIG. 2 and FIG. 12, in the device area A01, the first insulating layer 30 may cover the part of the metal layer 20 that does not need to be exposed on the surface of the circuit board. When forming the first insulating layer 30, the first insulating layer 30 may be disposed in the peripheral area A02 of the circuit board to improve the insulation of the circuit board in the peripheral area A02. For example, in one embodiment, the first insulating layer 30 may be made of ink. The ink has better insulating properties and may meet the insulating requirements of the circuit board. Further, by filling different color pigments, the ink may present different colors. Therefore, when ink is used as the first insulating layer 30, by filling the ink in the first peripheral area A1 and the second peripheral area A2 with pigments of different colors, the portions of the first insulating layer 30 in the first peripheral area A1 and the second peripheral area A2 may exhibit different colors respectively. In the peripheral area A02, there may be a clear boundary between the two portions of the first insulating layer 30 with different colors, and this boundary may be used as the adhesive outflow detection line 00. The rapid detection of poor adhesive overflow may be achieved, and the production process of the circuit board may be simplified, improving the production efficiency of the circuit board.

Figure 13:
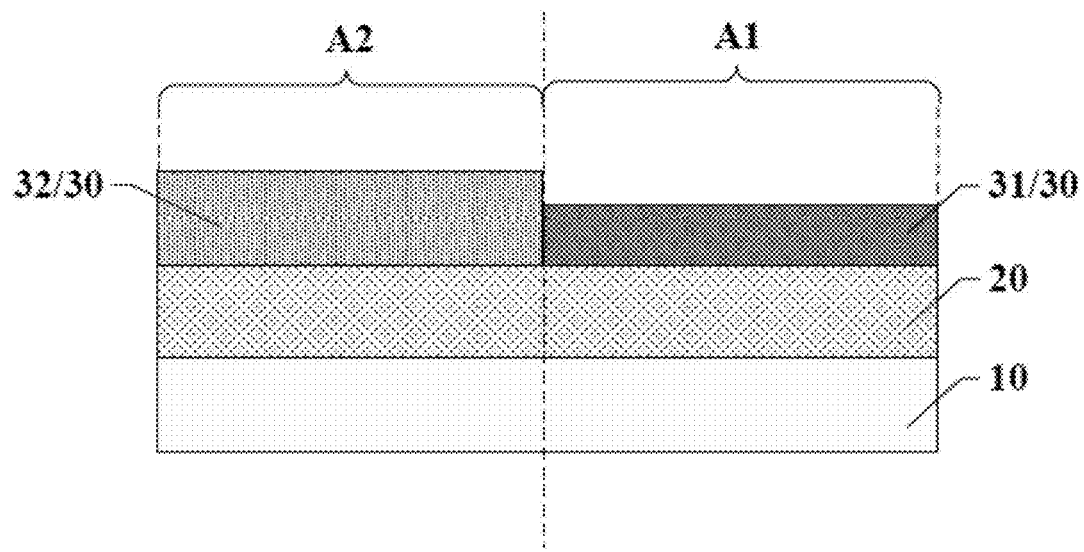
FIG. 13 illustrates a cross-sectional view of the circuit board in FIG. 12 along a D-D direction consistent with various disclosed embodiments in the present disclosure.

FIG. 13 illustrates a cross-sectional view of the circuit board in FIG. 12 along a D-D direction. In the embodiment shown in FIG. 13, a thickness of the insulating layer in the first peripheral area A1 may be smaller than a thickness of the insulating layer in the second peripheral area A2, along the direction perpendicular to the substrate 10.

Specifically, since the first peripheral area A1 is located between the second peripheral area A2 and the device area A01, and the adhesive overflow detection line 00 is located on the contour of the first peripheral area A1 away from the device area A01, by setting the thickness of the insulating layer in the first peripheral area A1 to be smaller and the thickness of the insulating layer in the second peripheral area A2 to be larger, along the direction perpendicular to the substrate 10, the surface of the peripheral area A2 away from the substrate 10 may be higher than the surface of the first peripheral area A1 away from the substrate 10. When the adhesive layer is formed in the device layer, even when the adhesive layer overflows and flows into the first peripheral area A1, since the overall thickness of the second peripheral area A2 is larger than the overall thickness of the first peripheral area A1, the second peripheral area A2 may form a barrier wall at a side facing the first peripheral area A1, to prevent the adhesive layer from overflowing. The adhesive layer may be prevented from further spreading into the second peripheral area A2 to a certain extent, which may be beneficial to reduce the occurrence of bad adhesive overflow in the circuit board and improve the production yield of circuit boards.

It should be noted that when the thicknesses of the insulating layers in the first peripheral area A1 and the second peripheral area A2 are designed differentially, when the insulating layers in the first peripheral area A1 and the second peripheral area A2 are both the first insulating layer 30, the insulating layer in the first peripheral area A1 may be thinned, or the insulating layer in the second peripheral area A2 may be thickened, to achieve that the thicknesses of the insulating layers in the first peripheral area A1 and the second peripheral area A2 are different. For description purposes only, the embodiment of FIG. 13 where the number of insulating layers in the first peripheral area A1 and the number of insulating layers in the second peripheral area A2 are the same and both are one layer is used as an example to illustrate the present disclosure, and does not limit the scope of the present disclosure. In other embodiments, the number of insulating layers in the first peripheral area A1 and the second peripheral area A2 may be set to other suitable values according to actual requirements. For example, in one embodiment illustrated in FIG. 14 and FIG. 15 showing a cross-sectional view of the circuit board in FIG. 12 along the D-D direction respectively, the number of insulating layers in the second peripheral area A2 and the first peripheral area A1 may be different.

Figure 14:
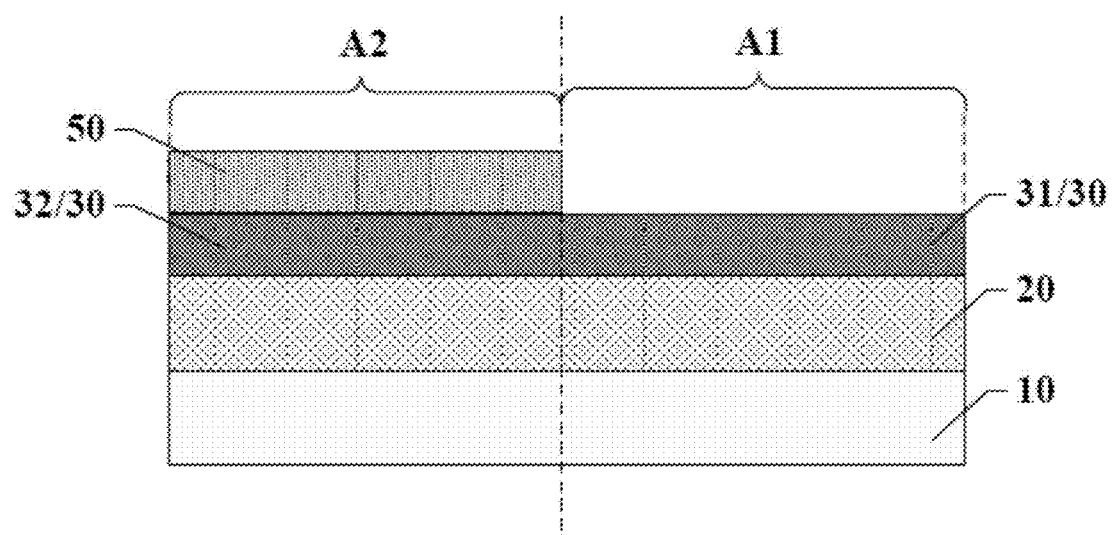
FIG. 14 illustrates another cross-sectional view of the circuit board in FIG. 12 along the D-D direction consistent with various disclosed embodiments in the present disclosure.
Figure 15:
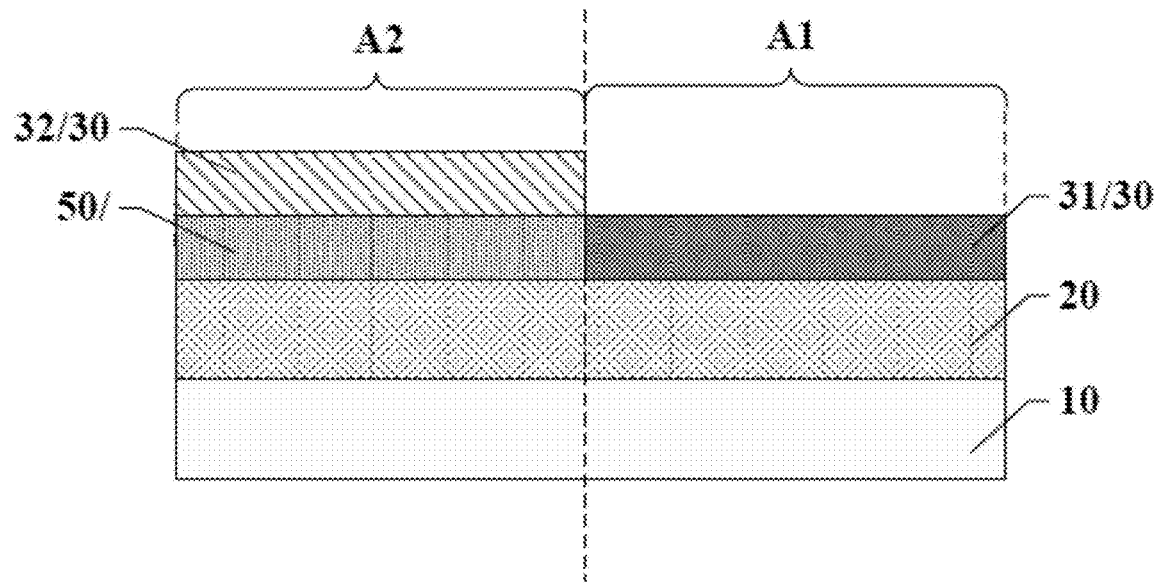
FIG. 15 illustrates another cross-sectional view of the circuit board in FIG. 12 along the D-D direction consistent with various disclosed embodiments in the present disclosure.

As shown in FIG. 14 and FIG. 15, in one embodiment, the circuit board may further include a second insulating layer 50. The first insulating layer 30 may be located in the device area A01, the first peripheral area A1, and the second peripheral area A2. The second insulating layer 50 may be located at a side of the first insulating layer 30 away from the substrate 10, or the second insulating layer 50 may be located between the first insulating layer 30 and the substrate 10.

In one embodiment shown in FIG. 14, in the second peripheral area A2, the first insulating layer 30 may be located between the second insulating layer 50 and the substrate 10. In one embodiment shown in FIG. 15, in the second peripheral area A2, the second insulating layer 50 may be located between the first insulating layer 30 and the substrate 10. In these embodiments, the number of insulating layers in the second peripheral area A2 may be larger than the number of insulating layers in the first insulating layer 30, such that the thickness of the film layers in the second peripheral area A2 away from the surface of the substrate 10 may be larger than the thickness of the film layers in the first peripheral area A1 away from the surface of the substrate 10. Correspondingly, the second peripheral area A2 may form a barrier wall at a side facing the first peripheral area A1, to prevent the adhesive layer from overflowing. The adhesive layer may be prevented from further spreading into the second peripheral area A2 to a certain extent, which may be beneficial to reduce the occurrence of bad adhesive overflow in the circuit board and improve the production yield of circuit boards.

It should be noted that, as shown in FIG. 14, when the second insulating layer 50 is disposed at the side of the first insulating layer 30 away from the substrate 10, the color of the second insulating layer 50 may be set to be different from the color of the first insulating layer 30. The colors of the first portion 31 in the first peripheral area A01 and the second portion 32 in the second peripheral area A02 of the first insulating layer 30 may be set to be the same. Correspondingly, the boundary between the second insulating layer 50 in the second peripheral area A2 and the first insulating layer 30 located in the first peripheral area A1 may be regarded as the adhesive overflow detection line 00.

As shown in FIG. 15, when the second insulating layer 50 is disposed at the side of the second portion 32 of the first insulating layer 30 facing the substrate 10, the first portion 31 and the second portion 32 of the first insulating layer 30 may be set to different colors, such that the boundary between the first portion 31 and the second portion 32 of the first insulating layer 30 may be used as the adhesive overflow detection line.

As shown in FIGS. 12, 14 and 15, in another embodiment, the first insulating layer 30 may be set as an ink layer, and the second insulating layer 50 may be set as a cover film.

Specifically, when the metal layer 20, such as a gold foil, in the device area A01 is used to form the circuit structure, in existing technologies, the device area A01 may be covered with a cover film, to cover the parts of the metal layer 20 that do not need to be exposed. However, the accuracy of the cover film is not high, and some detailed areas may be difficult to be covered effectively. Therefore, the ink may be added after forming the cover film, and the ink may be used for secondary covering, to achieve the insulation requirement of the device area A01. It should be noted that, in existing technologies, when the cover film and the ink layer are formed in the device area A01, the ink layer and the cover film usually extend into the peripheral area A02. Taking into account that the coverage accuracy is relatively high when the device area A01 is covered by ink, in one embodiment of the present disclosure, the cover film may be provided only in the second peripheral area A2, and may not be provided in the first peripheral area A1 and the device area A01, such that the cover film is used to increase the height of the second peripheral area A2. Further, the cover film may be a commonly used film structure in the manufacture of circuit boards. The film forming process may be relatively mature. Correspondingly, there may be no need to introduce new materials into the circuit board to form the barrier structure in the second peripheral area A2 for preventing the diffusion of the adhesive layer, and the complexity of the process may be not increased.

In the embodiments shown in FIG. 13 to FIG. 15, the thickness of the insulating layers in the first peripheral area A1 and the second peripheral area A2 may be designed differentially to prevent the overflow of the adhesive layer. In some other embodiments, the thickness of portions of the metal layer 20 in the first peripheral area A1 and the second peripheral area A2 may be designed differentially to prevent the overflow of the adhesive layer.

Figure 16:
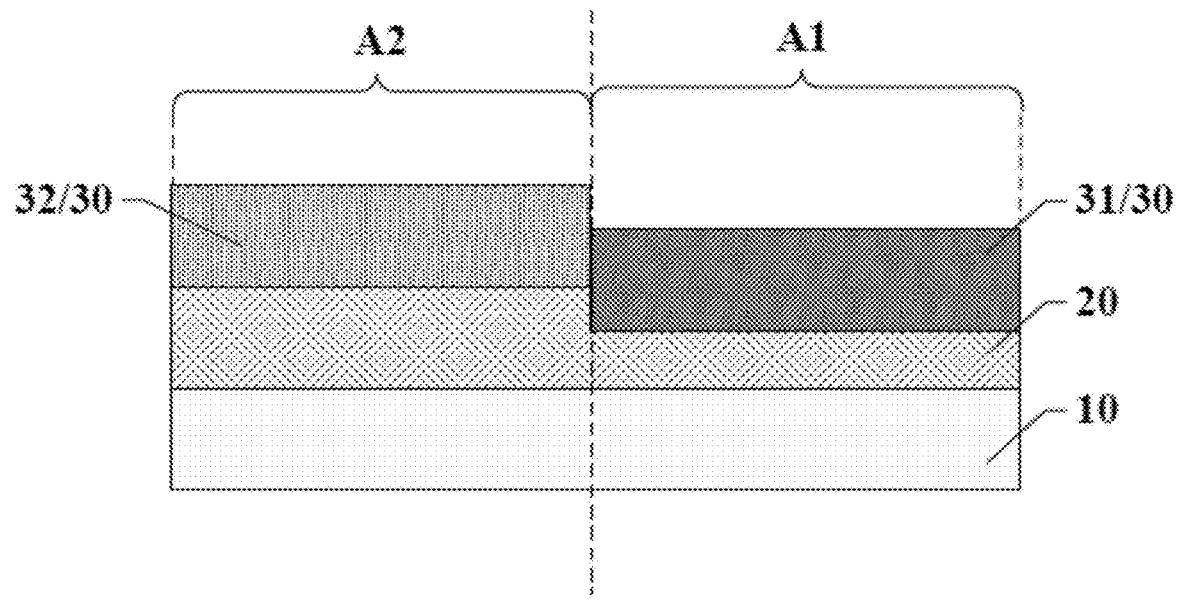
FIG. 16 illustrates a cross-sectional view of the circuit board in FIG. 1 along an E-E direction consistent with various disclosed embodiments in the present disclosure.

For example, in one embodiment in FIG. 16 showing a cross-sectional view of the circuit board in FIG. 1 along an E-E direction, along the direction perpendicular to the substrate 10, the thickness of a portion of the metal layer 20 in the first peripheral area A1 may be smaller than the thickness of a portion of the metal layer 20 in the second peripheral area A2.

Optionally, in one embodiment, the metal layer 20 located in the device area A01, the first peripheral area A1, and the second peripheral area A2 may be a structure that is connected and integrally formed. That is, a same metal film may be formed first, and then the metal layer may be formed by etching or performing other related operations on the metal film. For the portions of the metal layer 20 located in the first peripheral area A1 and the second peripheral area A2, the thickness of the portion of the metal layer 20 in the first peripheral area A1 may be made smaller than the thickness of the portion of the metal layer 20 in the second peripheral area A2, such that the surface of the film layers as a whole in the first peripheral area A1 away from the surface of the substrate 10 may be lower than the surface of the film layers as a whole in the second peripheral area A2 away from the surface of the substrate 10. Correspondingly, when the adhesive layer diffuses into the first peripheral area A1, the second peripheral area A2 may form a barrier wall at a side facing the first peripheral area A1 because of the thickness difference of the first peripheral area A1 and the second peripheral area A2, to prevent the adhesive layer from overflowing. The adhesive layer may be prevented from further spreading into the second peripheral area A2 to a certain extent, which may be beneficial to reduce the occurrence of bad adhesive overflow in the circuit board and improve the production yield of circuit boards.

Figure 17:
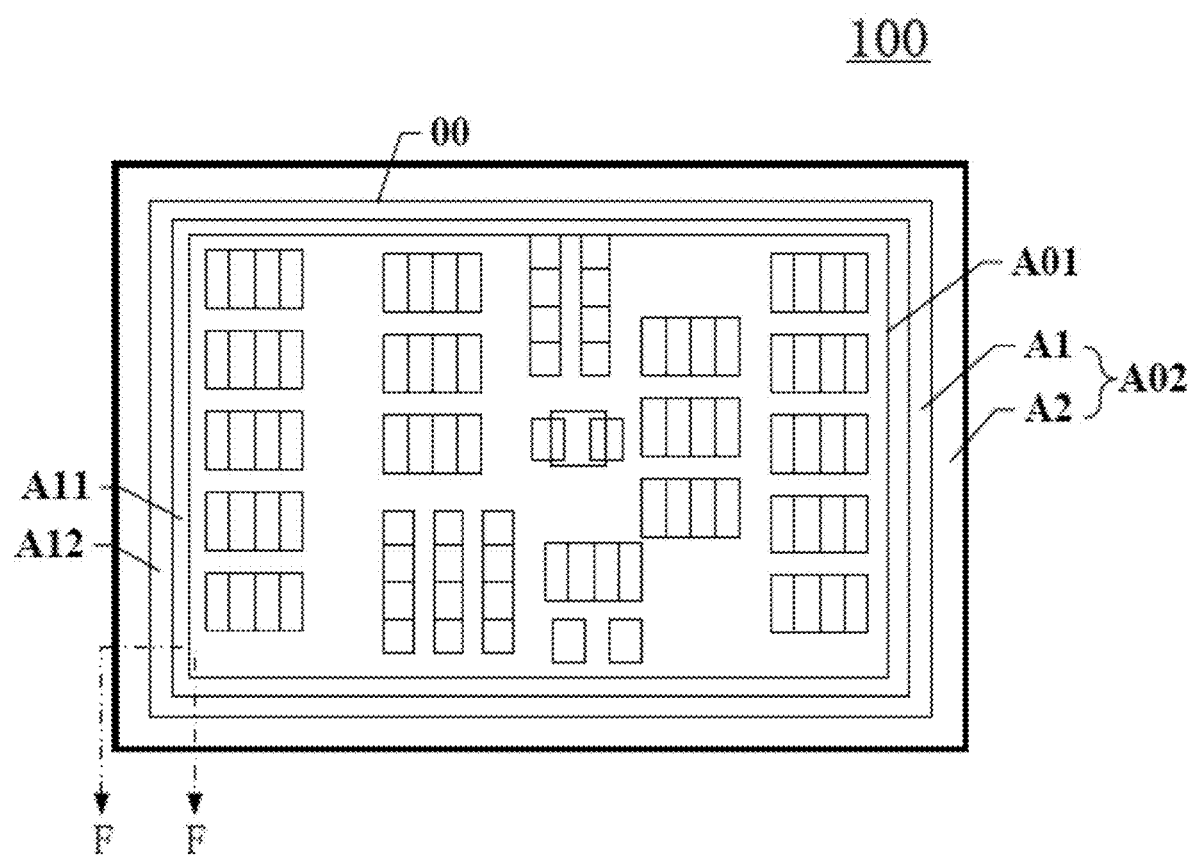
FIG. 17 illustrates a top view of another exemplary circuit board consistent with various disclosed embodiments in the present disclosure.
Figure 18:
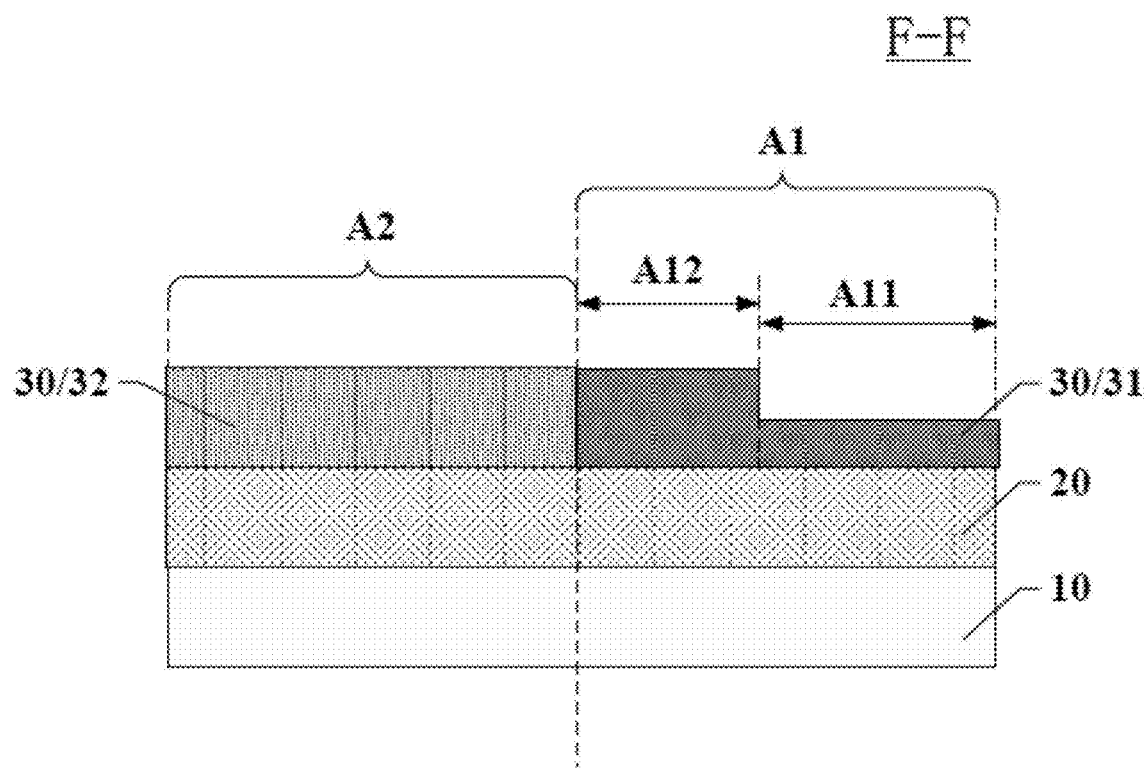
FIG. 18 illustrates a cross-sectional view of the circuit board in FIG. 17 along an F-F direction consistent with various disclosed embodiments in the present disclosure.

In another embodiment illustrated in FIG. 17 and FIG. 18 where FIG. 17 is a top view of the circuit board in the present embodiment and FIG. 18 is a cross-sectional view of the circuit board in FIG. 17 along an F-F direction, the first peripheral area A1 may include a first area A11 and a second area A12. The first area A11 may surround the device area A01, and the second area A12 may surround the first area A11. Along the direction perpendicular to the substrate 10, the thickness of the insulating layer in the first area A11 may be smaller than the thickness of the insulating layer in the second area A12.

Specifically, in the embodiment shown in FIG. 17 and FIG. 18, the thickness of the insulating layer in the peripheral area A02 may be designed differentially. In this embodiment, the first peripheral area A1 may be divided into the first area A11 surrounding device area and the second area A12 surrounding the first area A11. The thickness of the insulating layers in the first area A11 and the second area A12 of the first peripheral area A1 may be designed differentially, such that the thickness of the insulating layer in the first area A11 may be set to be smaller than the thickness of the insulating layer in the second area A12. Thus, when the adhesive layer of the device area A01 diffuses to the first area A11, the height difference of the first area A11 and the second area A12 may reduce the possibility of the adhesive layer further spreading to the second area A12. Further, the adhesive overflow detection line 00 may be the contour of the second area A12 away from the first area A11. In this embodiment, by setting the height difference of the first area A11 and the second area A12, the possibility of the adhesive layer spreading to the adhesive overflow detection line 00 may be also reduced, beneficial to improve the production yield of the circuit board.

Figure 19:
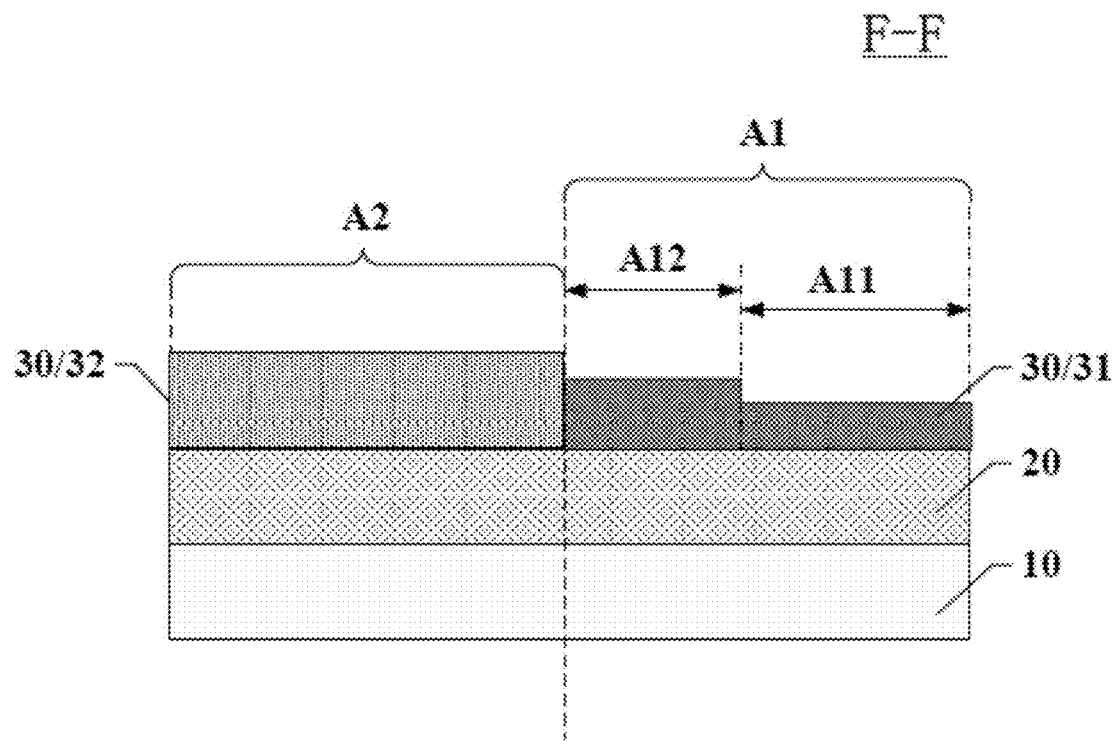
FIG. 19 illustrates another cross-sectional view of the circuit board in FIG. 17 along the F-F direction consistent with various disclosed embodiments in the present disclosure.

Optionally, in some embodiments, while the thicknesses of the first area A11 and the second area A12 of the first peripheral area A1 are differentially designed, the thicknesses of the second area A12 and the second peripheral area A2 may also be differentially designed. For example, as shown in FIG. 19 which is another cross-sectional view of the circuit board in FIG. 17 along the F-F direction, that the total thickness of the film layers located in the first area A11 may be set to be smaller than the total thickness of the film layers located in the second area A12, and the total thickness of the film layers located in the second area A12 may also be set to be smaller than the total thickness of the film layers in the second peripheral area A2. Correspondingly, it may be equivalent to setting up two barrier walls for the overflow of the adhesive layer. The occurrence of poor adhesive overflow may be further reduced, improving the production yield of circuit boards.

Figure 20:
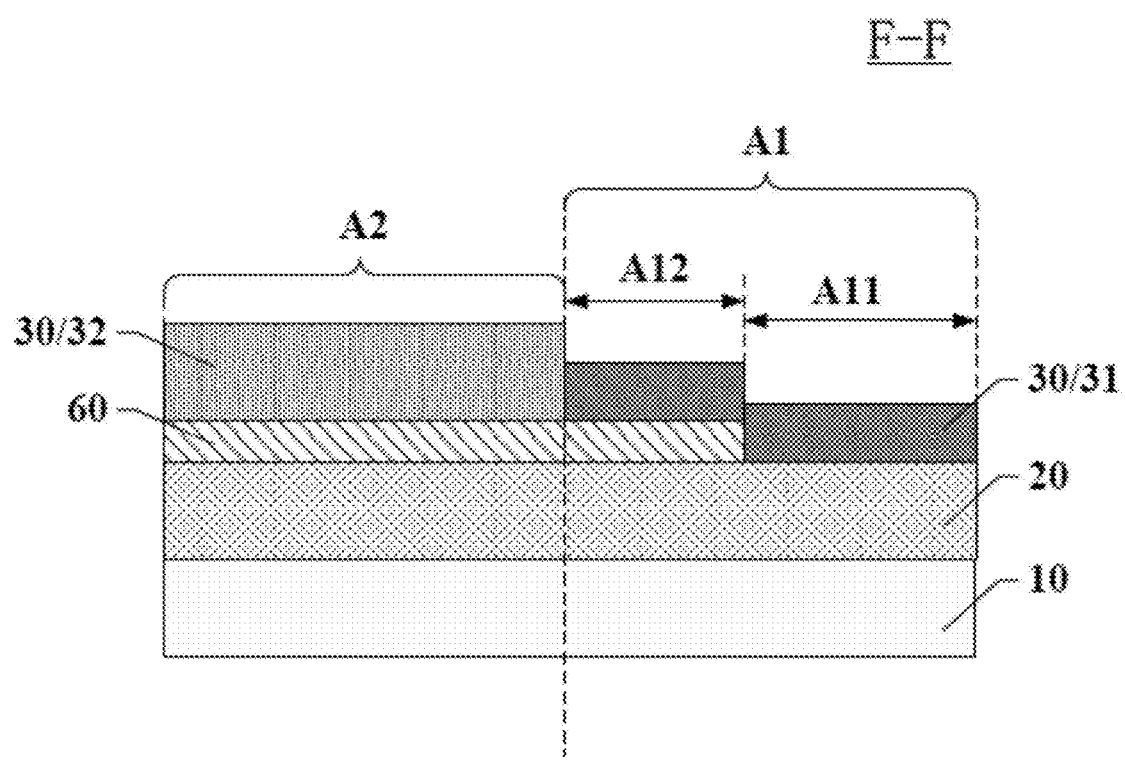
FIG. 20 illustrates another cross-sectional view of the circuit board in FIG. 17 along the F-F direction consistent with various disclosed embodiments in the present disclosure.

In another embodiment shown in FIG. 20 which is another cross-sectional view of the circuit board in FIG. 17 along the F-F direction, the circuit board may further include a third insulating layer 60 located in the second area A12.

Specifically, in the present embodiment, the third insulating layer 60 may be added in the second area A12 of the first peripheral area A1, such that the overall thickness of the second area A12 is larger than the overall thickness of the first area A11. Correspondingly, the film layers in the second area A12 may form a barrier to prevent the adhesive layer from further spreading, reducing the possibility of poor adhesive overflow on the circuit board.

In another embodiment illustrated in FIG. 20, the third insulating layer 60 may be also located in the second periphery area A2.

Specifically, in the present embodiment, the third insulating layer 60 may be added to the second area A12 of the first peripheral area A1 and also to the second peripheral area A2, such that the overall thickness of the second peripheral area A2 is at least equivalent to the overall thickness of the second area A12. Correspondingly, accelerating the expansion of the adhesive layer induced by the overall thickness of the second peripheral area A2 smaller than the overall thickness of the second area A12 in the first peripheral area A1, may be prevented. It should be noted that when the overall thickness of the second peripheral area A2 needs to be set to be larger than the overall thickness of the second area A12, it may be achieved by increasing the thickness of the third insulating layer 60 of the second peripheral area A2, or may be achieved by increasing the thickness of the first insulating layer 30 in the second peripheral area A2, which is not specifically limited in the present disclosure.

In one embodiment, the third insulating layer 60 may be a cover film. As mentioned above, the cover film is a common material in the field of circuit board manufacturing. The process of forming a cover film on the circuit board is relatively mature. When the cover film is used as the third insulating layer 60, there may be no need to introduce new materials and new production process to realize the differential design of the thickness of the peripheral area A02 of the circuit board. The complexity of the production process may be not increased.

It should be noted that in the various embodiments shown in FIGS. 12 to 20, the thickness of the first peripheral area and the second peripheral area may be designed differentially to prevent the overflow of the adhesive layer. At this time, the thickness of the insulating layers in the first and second peripheral areas may be designed differentially, or the thickness of the insulating layers and metal layer in the first peripheral area and the second peripheral area may be designed differentially at the same time. When the thicknesses of the first peripheral area and the second peripheral area are designed differentially, hollow parts may be formed on the metal layer in the first peripheral area at the same time. That is, the above-mentioned embodiments of may be combined, and the present invention does not show all of them.

Figure 21:
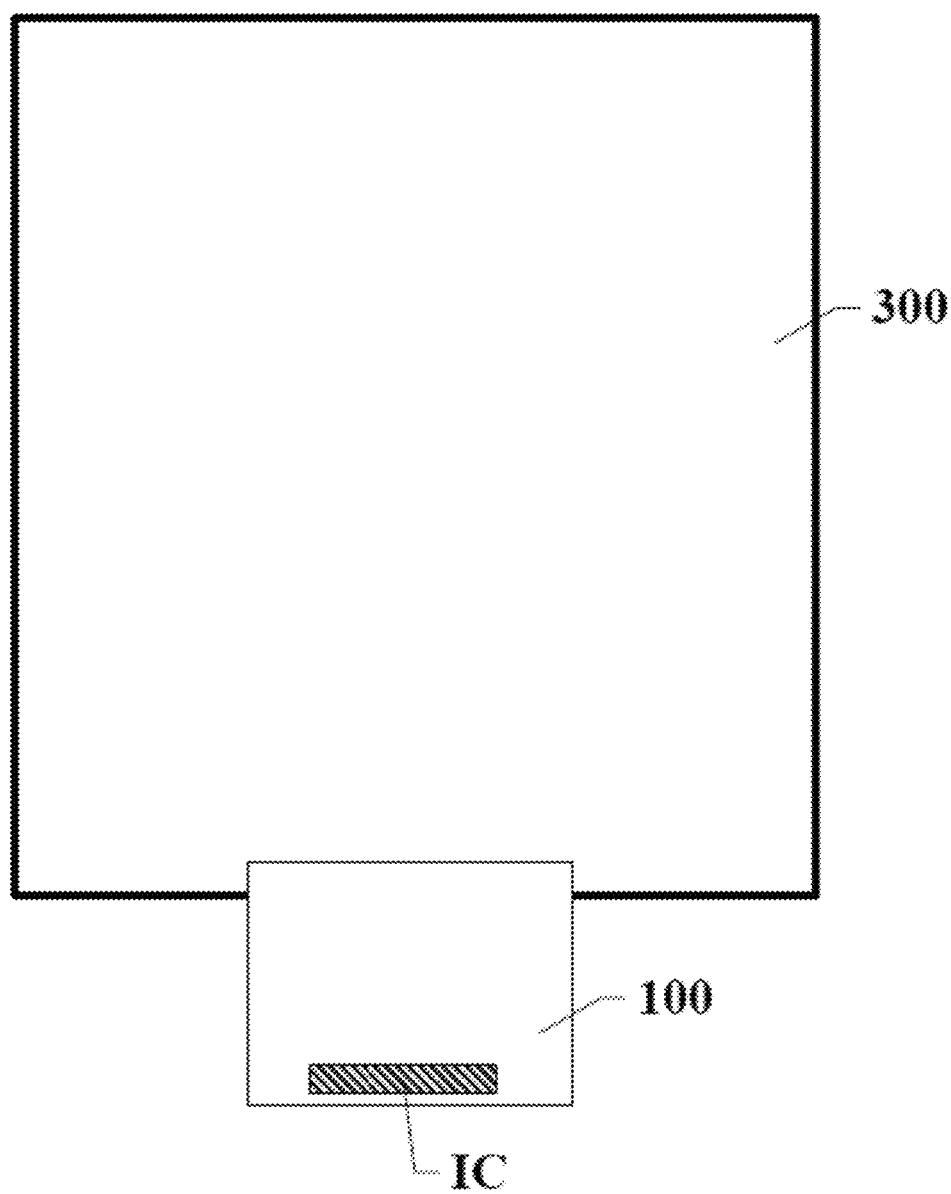
FIG. 21 illustrates an exemplary display device consistent with various disclosed embodiments in the present disclosure.

The present disclosure also provides a display device. As shown in FIG. 21, in one embodiment, the display device 200 may include a circuit board 100 provided by various embodiments of the present disclosure. The display device 200 may further include a display panel 300. The display panel 300 may be provided with a binding area. The circuit board 100 may be bound to the binding area of the display panel 300. Optionally, the circuit board may be bound with a control chip IC. The circuit board provided by the embodiment of the present disclosure may realize the rapid detection of the poor adhesive overflow by visual way. In some embodiments, the structure design of the circuit board may also reduce the occurrence of bad phenomenon of adhesive overflow, to improve the production yield of the circuit board and the overall production yield of the display device.

Figure 22:
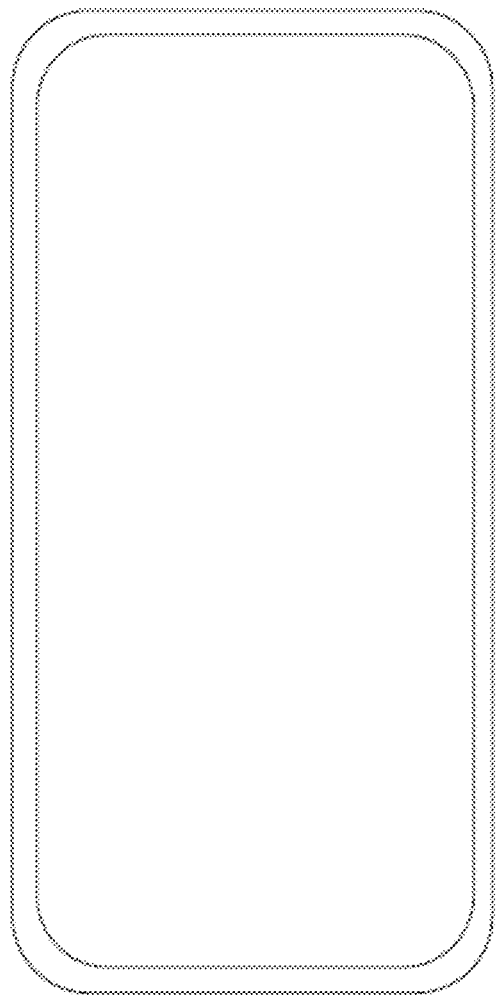
FIG. 22 illustrates a top view of an exemplary display device consistent with various disclosed embodiments in the present disclosure.

Optionally, the circuit board included in the display device may be a flexible circuit board. In practical applications, the flexible circuit board may be folded back to the non-display surface of the display panel to effectively reduce the frame width of the display device and realize a narrow frame. For example, as shown in FIG. 22 which is a top view of a display device provided by an embodiment of the present disclosure, the flexible circuit board may be folded back to the non-display surface of the display panel.

It should be noted that, for the embodiments of the display panel provided in the present disclosure, reference may be made to the embodiments of the circuit board in the present disclosure, and the repetitive parts will not be repeated. The display device provided by the embodiments of the present disclosure may be any product or component with a display function, such as a mobile phone, a tablet computer, a television, a monitor, a notebook computer, a digital photo frame, a navigator, and the like.

In the circuit board and the display device provided by the present disclosure, the circuit board may include the device area and the peripheral area around the device area. The device area may be provided with circuit structures such as signal lines and soldering pads, for example. The device area may be used to bind electronic components and the like. The substrate of the circuit board may be provided with the metal layer, and the aforementioned circuit structure may be formed from the metal layer. The first insulating layer may be provided at the side of the metal layer away from the substrate, and the part of the metal layer that does not need to be exposed on the surface of the circuit board may be covered by the first insulating layer. The exposed part of the metal layer can be, for example, the soldering pads, etc. After the electronic components are bound on the soldering pads, the exposed parts of the soldering pads may be covered by the adhesive layer, which may not only be waterproof, but also play a role in fixing the electronic components. In the process of using the adhesive layer to fix the soldering pads and the electronic components, the adhesive layer may have certain fluidity. To determine whether the adhesive layer has poor adhesive overflow, etc., the adhesive overflow detection line may be provided in the peripheral area of the circuit board. When the adhesive overflow detection line is located in the metal layer, the metal layer in the peripheral area may be provided with hollow parts. By visually observing the relative position relationship between the adhesive layer and the hollow parts, it may be accurately determined whether there is adhesive overflow. When the adhesive overflow detection line is located in the first insulating layer, the portions of the first insulation layer at two sides of the adhesive overflow detection line may be set to different colors. By visually observing the positional relationship of the adhesive layer and the insulating layer with different colors in the peripheral area, it may be accurately determined whether there is adhesive overflow. Therefore, in the present disclosure, the adhesive overflow of the circuit board may be accurately determined by visually observation after introducing the adhesive overflow detection line on the circuit board. While improving the detection accuracy, the detection cost may be saved and the detection efficiency may be significantly improved, thereby improving the quality of the display device.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A circuit board with a device area and a peripheral area surrounding the device area, comprising:
a substrate, a metal layer, a first insulating layer, an adhesive layer, and an adhesive overflow detection line, wherein:
the metal layer, the first insulating layer, and the adhesive layer are disposed at a same side of the substrate;
the metal layer and the first insulating layer cover at least a part of the peripheral area;
the metal layer is disposed between the first insulating layer and the substrate;
the adhesive layer is disposed at a side of the first insulating layer away from the substrate;
the adhesive overflow detection line is disposed in the peripheral area and surrounds the whole device area; and
the adhesive overflow detection line is located in the metal layer and the metal layer in the peripheral area is provided with hollow parts that surround the whole device area; and/or, the adhesive overflow detection line is located in the first insulating layer and a portion of the first insulating layer in the peripheral area has a color different from other portions of the first insulating layer.

2. The circuit board according to claim 1, wherein:
the peripheral area includes a first peripheral area and a second peripheral area;
the first peripheral area surrounds the device area and the second peripheral area surrounds the first peripheral area; and
the adhesive overflow detection line coincides with a contour of the first peripheral area away from the device area.

3. The circuit board according to claim 2, wherein:
a first portion of the metal layer in the first peripheral area is provided with the hollow parts, and a second portion of the metal layer in the second peripheral area is not provided with the hollow parts; and
a contour of the first portion of the metal layer in the first peripheral area away from the device area is multiplexed as the adhesive overflow detection line.

4. The circuit board according to claim 3, wherein:
the first portion of the metal layer in the first peripheral area has a mesh structure or a curved wiring structure.

5. The circuit board according to claim 2, wherein:
a contour of a portion of the metal layer in the first peripheral area away from the device area is multiplexed as the adhesive overflow detection line; and
hollow parts are provided between the portion of the metal layer in the first peripheral area and a portion of the metal layer in the second peripheral area.

6. The circuit board according to claim 5, wherein:
a width of the hollow parts along a direction from the second peripheral area to the first peripheral area is D, and D≤0.1 mm.

7. The circuit board according to claim 2, wherein:
the first insulating layer includes a first portion in the first peripheral area and a second portion in the second peripheral area;
the first portion and the second portion have different colors; and
a contour of the first portion away from the device area is multiplexed as the adhesive overflow detection line.

8. The circuit board according to claim 7, wherein the first insulating layer is an ink layer.

9. The circuit board according to claim 2, wherein:
along the direction perpendicular to the substrate, a thickness of an insulating layer in the first peripheral area is smaller than a thickness of the insulating layer in the second peripheral area.

10. The circuit board according to claim 9, further including a second insulating layer, wherein:
the first insulating layer is located in the device area, the first peripheral area, and the second peripheral area;
the second insulating layer is located in the second peripheral area; and
along the direction perpendicular to the substrate, the second insulating layer is located at a side of the first insulating layer away from the substrate, or between the first insulating layer and the substrate.

11. The circuit board according to claim 9, wherein:
the first insulating layer is an ink layer and the second insulating layer is a cover film.

12. The circuit board according to claim 2, wherein:
along the direction perpendicular to the substrate, a thickness of a portion of the metal layer in the first peripheral area is smaller than a thickness of a portion of the metal layer in the second peripheral area.

13. The circuit board according to claim 2, wherein:
the first peripheral area includes a first area and a second area;
the first area surrounds the device area and the second area surrounds the first area; and
along the direction perpendicular to the substrate, a thickness of an insulating layer in the first area is smaller than a thickness of the insulating layer in the second area.

14. The circuit board according to claim 13, further including a third insulating layer in the second area.

15. The circuit board according to claim 14, wherein the third insulating layer is also located in the second peripheral area.

16. The circuit board according to claim 14, wherein the third insulating layer is a cover film.

17. The circuit board according to claim 1, wherein the hollow parts penetrate through the metal layer along a direction perpendicular to the substrate.

18. A display device, comprising a circuit board with a device area and a peripheral area surrounding the device area, wherein:
the circuit board includes a substrate, a metal layer, a first insulating layer, an adhesive layer, and an adhesive overflow detection line, wherein:
the metal layer, the first insulating layer, and the adhesive layer are disposed at a same side of the substrate;
the metal layer and the first insulating layer cover at least a part of the peripheral area;
the metal layer is disposed between the first insulating layer and the substrate;
the adhesive layer is disposed at a side of the first insulating layer away from the substrate;
the adhesive overflow detection line is disposed in the peripheral area and surrounds the whole device area; and
the adhesive overflow detection line is located in the metal layer and the metal layer in the peripheral area is provided with hollow parts that surround the whole device area; and/or the adhesive overflow detection line is located in the first insulating layer and a portion of the first insulating layer in the peripheral area has a color different from other portions of the first insulating layer.

* * * * *